US011442262B2

(12) United States Patent
Sase et al.

(10) Patent No.: US 11,442,262 B2
(45) Date of Patent: Sep. 13, 2022

(54) IMAGE PROCESSING DEVICE, MICROSCOPE SYSTEM, IMAGE PROCESSING METHOD, AND PROGRAM

(71) Applicant: NIKON CORPORATION, Tokyo (JP)

(72) Inventors: Ichiro Sase, Yokohama (JP); Yutaka Sasaki, Yokohama (JP); Takaaki Okamoto, Fujisawa (JP); Yuki Terui, Tokyo (JP); Kohki Konishi, Yokohama (JP); Masafumi Mimura, Ageo (JP); Martin Berger, Prague (CZ); Petr Gazak, Chyne (CZ); Miroslav Svoboda, Jilove u Prahy (CZ)

(73) Assignee: NIKON CORPORATION, Tokyo (JP)

( * ) Notice: Subject to any disclaimer, the term of this patent is extended or adjusted under 35 U.S.C. 154(b) by 393 days.

(21) Appl. No.: 16/478,434

(22) PCT Filed: Jan. 16, 2017

(86) PCT No.: PCT/JP2017/001289
§ 371 (c)(1),
(2) Date: Jul. 16, 2019

(87) PCT Pub. No.: WO2018/131172
PCT Pub. Date: Jul. 19, 2018

(65) Prior Publication Data
US 2020/0218054 A1 Jul. 9, 2020

(51) Int. Cl.
*G06K 9/00* (2022.01)
*G02B 21/36* (2006.01)
(Continued)

(52) U.S. Cl.
CPC ....... *G02B 21/365* (2013.01); *G01N 21/6458* (2013.01); *G06T 7/37* (2017.01);
(Continued)

(58) Field of Classification Search
CPC .............. G02B 21/365; G02B 21/0024; G02B 21/0076; G02B 27/58; G02B 21/367;
(Continued)

(56) References Cited

U.S. PATENT DOCUMENTS 7,463,761 B2 * 12/2008 Eichhorn ............. H04N 13/395
382/133
7,689,024 B2 3/2010 Eichhorn et al.
(Continued)

FOREIGN PATENT DOCUMENTS

AU      2006203027 B2 * 11/2009 ......... H04N 1/00737
DE   10 2008 054 317 A1    5/2010
(Continued)

OTHER PUBLICATIONS

Kodama et al.; "Virtual Bokeh Reconstruction from a Single System of Lenses;" The Journal of the Institute of Image Information and Television Engineers; 2011; pp. 372-381; vol. 65, No. 3.
(Continued)

*Primary Examiner* — Tom Y Lu
(74) *Attorney, Agent, or Firm* — Oliff PLC

(57) ABSTRACT

An image processor includes an image generator configured to generate corresponding image data corresponding to first microscopic image data obtained under a first observation condition, based on second microscopic image data and third microscopic image data obtained under a second observation condition, and an image output unit configured to output the corresponding image data. The corresponding image data may be image data corresponding to a first focal plane from which the first microscopic image data are obtained, and wherein the second microscopic image data and the third microscopic image data may be image data on a second focal plane and a third focal plane, respectively, which are different from the first focal plane.

37 Claims, 24 Drawing Sheets

(51) Int. Cl.
  *G06T 7/37* (2017.01)
  *G01N 21/64* (2006.01)

(52) U.S. Cl.
  CPC ............ *G06T 2207/10056* (2013.01); *G06T 2207/20048* (2013.01)

(58) Field of Classification Search
  CPC .......... G01N 21/6458; G06T 7/37; G06T 2207/10056; G06T 2207/20048; G06T 5/50; G06T 2207/20221; H01J 37/222; H01J 37/28; H01J 2237/226; H01J 37/26
  See application file for complete search history.

(56) References Cited

U.S. PATENT DOCUMENTS

| | | | |
|---|---|---|---|
| 7,860,292 | B2 | 12/2010 | Eichhorn et al. |
| 8,565,480 | B2 | 10/2013 | Eichhorn et al. |
| 8,923,597 | B2 | 12/2014 | Eichhorn et al. |
| 9,069,179 | B2 | 6/2015 | Eichhorn et al. |
| 2003/0025087 | A1 | 2/2003 | Schamber et al. |
| 2004/0167806 | A1* | 8/2004 | Eichhorn ............... G16H 30/40 705/3 |
| 2006/0007533 | A1 | 1/2006 | Eichhorn et al. |
| 2009/0116733 | A1 | 5/2009 | Eichhorn et al. |
| 2010/0177166 | A1 | 7/2010 | Eichhorn et al. |
| 2011/0090223 | A1 | 4/2011 | Eichhorn et al. |
| 2011/0284767 | A1 | 11/2011 | Wolleschensky et al. |
| 2014/0044346 | A1 | 2/2014 | Eichhorn et al. |
| 2014/0333751 | A1 | 11/2014 | Takayama et al. |
| 2015/0015578 | A1 | 1/2015 | Eichhorn et al. |
| 2015/0310613 | A1 | 10/2015 | Murakami |
| 2016/0088213 | A1 | 3/2016 | Miyai et al. |
| 2017/0108682 | A1 | 4/2017 | Langholz et al. |

FOREIGN PATENT DOCUMENTS

| | | |
|---|---|---|
| DE | 10 2014 004 249 A1 | 9/2015 |
| JP | H05-76517 A | 3/1993 |
| JP | 2012-507756 A | 3/2012 |
| JP | 2013-152426 A | 8/2013 |
| JP | 2013-239185 A | 11/2013 |
| JP | 2015-57682 A | 3/2015 |
| JP | 2016-62004 A | 4/2016 |

OTHER PUBLICATIONS

Mar. 6, 2018 Search Report issued in International Patent Application No. PCT/JP2017/001289.
Jul. 23, 2020 Extended Search Report issued in European Patent Application No. 17891716.7.
Apr. 25, 2017 Written Opinion of the International Searching Authority issued in International Patent Application No. PCT/JP2017/001289.
Apr. 25, 2017 Search Report issued in International Patent Application No. PCT/JP2017/001289.
Jun. 15, 2022 Office Action issued in European Patent Application No. 17891716.7.
Aug. 2, 2022 Office Action issued in Japanese Patent Application No. 2021-113684.

* cited by examiner

IMAGE PROCESSING DEVICE, MICROSCOPE SYSTEM, IMAGE PROCESSING METHOD, AND PROGRAM

TECHNICAL FIELD

The present disclosure relates to an image processor, a microscope system, an image processing method, and a program.

BACKGROUND ART

There is a known microscope system equipped with a plurality of types of microscopes (also referred to as modalities), each configured to capture images of specimens by mutually different microscopies (e.g., refer to JP 2012-507756 T).

SUMMARY

A first aspect of the present disclosure provides an image processor including an image generator configured to generate corresponding image data corresponding to first microscopic image data obtained under a first observation condition, based on second microscopic image data and third microscopic image data obtained under a second observation condition, and an image output unit configured to output the corresponding image data.

A second aspect of the present disclosure provides a microscope system including a first microscope, a second microscope, and the above-described image processor.

A third aspect of the present disclosure provides an image processing method including generating corresponding image data corresponding to first microscopic image data obtained under a first observation condition, based on second microscopic image data and third microscopic image data obtained under a second observation condition, and outputting the corresponding image data.

A fourth aspect of the present disclosure provides a program for causing a computer to, generate corresponding image data corresponding to first microscopic image data obtained under a first observation condition, based on second microscopic image data and third microscopic image data obtained under a second observation condition, and output the corresponding image data.

Note that the aforementioned summary of the disclosure does not list all features of the present disclosure. The present disclosure may also be a sub-combination of these features.

DESCRIPTION OF EMBODIMENTS

Hereinafter, the present disclosure will be described through the embodiments of the disclosure, but the following embodiments do not limit the present disclosure, according to the claims. Not all of combinations of the features described in the embodiments are necessarily essential to the solving means of the disclosure.

A first embodiment of the present disclosure will now be described.

Figure 1:
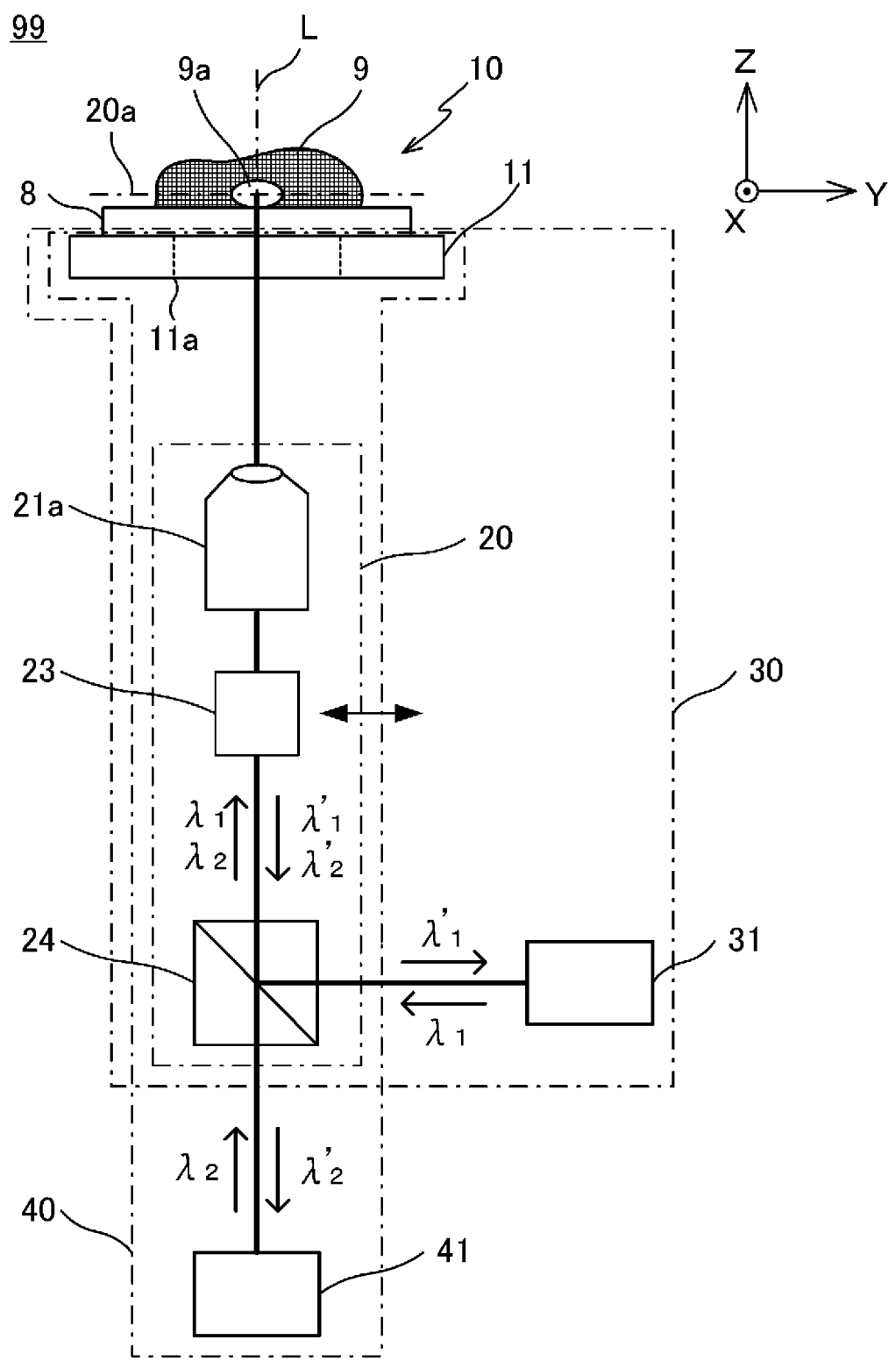
FIG. 1 illustrates a configuration of a body included in a microscope system according to a first embodiment.
Figure 2:
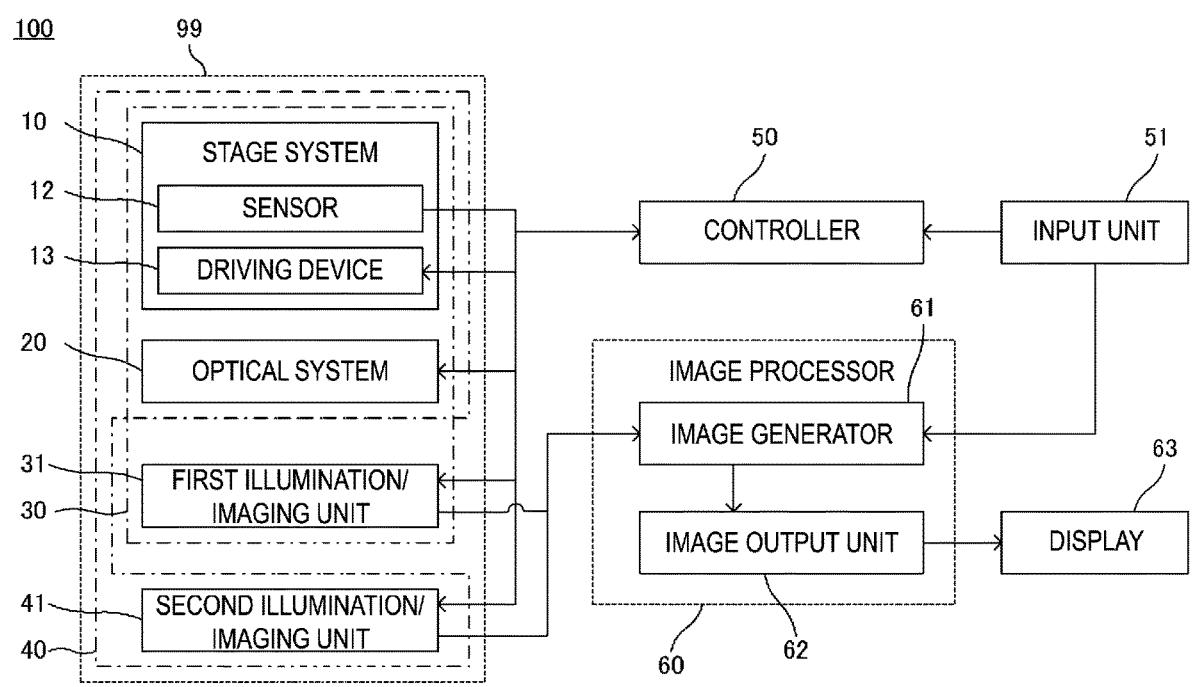
FIG. 2 illustrates a functional configuration of a microscope system according to the first embodiment.

FIGS. 1 and 2 illustrate a configuration of a body 99 included in a microscope system 100 according to the first embodiment, and a functional configuration of the microscope system 100, respectively. The microscope system 100 is a system configured to capture images of a specimen using a plurality of types of microscopes by different microscopies, where the system includes a body 99, a ¥controller 50, and an image processor 60. Note that, for convenience of explanation, a Z-axis is defined in parallel with an optical axis L of an optical system 20 to be described below in FIG. 1.

The body 99 includes a first microscope 30 configured to observe a specimen 9 under a first observation condition, and a second microscope 40 configured to observe the specimen 9 under a second observation condition. The first and second observation conditions include, for example, microscopy, illumination conditions, imaging conditions, and the like. In the first embodiment, a first microscopy, which is a microscopy of the first microscope 30, is a confocal microscopy, and a second microscopy, which is a microscopy of the second microscope 40, is structured illumination microscopy (SIM).

The illumination conditions include the brightness of illumination light for illuminating the specimen 9, the wavelength of the illumination light, whether polarized light is used for the illumination light and orientation of polarization when polarized light is used, aperture size, and the like. The imaging conditions include the numerical apertures of an objective lens 21a, a range within an XY plane (referred to as XY scanning range) and a position on the Z-axis (referred to as Z position) for capturing images of the specimen 9, and the like.

The first microscope 30 and the second microscope 40 share a stage system 10. The stage system 10 is a system for supporting and moving the specimen 9, and includes a stage 11, a sensor 12, and a driving device 13. Here, the specimen 9 is, for example, a cell or the like into which fluorescent dyes have been introduced, and is used by holding the specimen 9 on a holding member 8 such as a translucent glass plate. In the first embodiment, two colors of fluorescent dyes, which are the fluorescent dye used in the first microscope 30 and the fluorescent dye used in the second microscope 40, are introduced.

The stage 11 is a device for supporting the specimen 9. The stage 11 is formed with an aperture 11a through which the optical axis L of the optical system 20 passes, where the specimen 9 is located above the aperture 11a by supporting the holding member 8 on the stage 11. The stage 11 is configured to be movable relative to the optical axis L of the optical system 20.

The sensor 12 is configured to measure the position or displacement in a Z-axis direction of the stage 11. A linear encoder, for example, can be employed as the sensor 12. The measurement result is sent to the controller 50.

The driving device 13 is configured to drive the stage 11 in the Z-axis direction. A plurality of motors and the like, for example, can be employed for the driving device 13. The driving device 13 is controlled by the controller 50 to drive the stage 11 to an objective position. The movement causes the specimen 9 on the stage 11 to move relative to the optical axis L of the optical system 20.

The first microscope 30 and the second microscope 40 share the optical system 20. The optical system 20, which is a system configured to converge light emitted from the specimen 9 while irradiating the specimen 9 with illumination light, includes the objective lens 21a, a scanner 23, and a filter 24.

The objective lens 21a is an optical element for focusing an intermediate image of the specimen 9 on the stage 11, which is disposed just below the stage 11, as an example in the first embodiment. In FIG. 1, a focal plane 20a, which is in parallel with the XY plane including the focal point of the optical system 20 that includes the objective lens 21a, is illustrated in conjunction therewith.

The scanner 23 has a mechanism configured to swing illumination light in a plane orthogonal to the optical axis L of the optical system 20, that is, in the XY direction in the drawing, where a pair of galvanomirrors can be used for the mechanism, as an example. One galvanomirror is rotated about an X-axis, while the other galvanomirror is rotated about a Y-axis. The illumination light incident on the scanner 23 is reflected by the pair of galvanomirrors to be swung in each of the X-axis and Y-axis direction relative to the optical axis L, whereby the specimen 9 is scanned in the XY direction. The scanner 23 can be moved onto the optical axis L or retracted from the optical axis L by a non-illustrated driving device, where the scanner 23 is retracted from the optical axis L when the specimen 9 is observed by SIM.

The filter 24 is an optical element disposed on the optical axis L of the optical system 20 to reflect light having a specific wavelength ($\lambda_1$, $\lambda_1'$) and to transmit light having another wavelength ($\lambda_2$, $\lambda_2'$). A dichroic mirror can be used for the filter 24, for example. The filter 24 reflects the illumination light (having a wavelength of $\lambda_1$) emitted from a first illumination/imaging unit 31 and sends the reflected light, via the scanner 23 and the objective lens 21a, to the specimen 9, and reflects light (having a wavelength of $\lambda_1'$) returning from the specimen 9 to the first illumination/imaging unit 31. The filter 24 further reflects the light (having a wavelength of $\lambda_2$) emitted from a second illumination/imaging unit 41 and sends the reflected light, via the scanner 23 and the objective lens 21a, to the specimen 9, and transmits the light (having a wavelength of $\lambda_2'$) returning from the specimen 9 to the second illumination/imaging unit 41.

The first microscope 30, which includes the first illumination/imaging unit 31, the optical system 20, and the stage system 10, is configured to capture an image of the specimen 9 by the first microscopy. In the first embodiment, a confocal microscopy is employed as the first microscopy, as described above. In the confocal microscopy, a two-dimensional image is generated in such a way that, while the specimen 9 is scanned in the XY direction on the focal plane 20a with illumination light from a non-illustrated laser light source of the first illumination/imaging unit 31, an image of a cross-section of the specimen 9 located on the focal plane 20a is captured with a non-illustrated imaging element of the first illumination/imaging unit 31. The specimen 9 is further displaced relative to the focal plane 20a in the Z-axis direction to capture images of different planes within the specimen 9. More specifically, images of the specimen 9 is scanned at a plurality of Z positions to capture images of the specimen 9, to thus generate a Z-stack image. The first microscope 30 can perform a high-speed observation of the specimen 9, but at a relatively low resolution.

The first illumination/imaging unit 31 is configured to illuminate the specimen 9 and to detect light from the specimen 9. The first illumination/imaging unit 31 is configured to generate illumination light, for example, illumination light having a wavelength $\lambda_1$ (e.g., 488 nm) in accordance with illumination conditions related to brightness, wavelength, polarization, aperture, and the like, and to emit the generated illumination light toward the optical system 20 (the filter 24) through a filter such as a non-illustrated dichroic mirror. The illumination light illuminates, through the optical system 20, an observation position 9a within the specimen 9 located on the focal plane 20a. Light such as fluorescence with a wavelength of $\lambda_1'$ (e.g., 525 nm) emitted from the specimen 9 due to the illumination light is incident on the first illumination/imaging unit 31 through the optical system 20. The first illumination/imaging unit 31 is configured to detect, with a non-illustrated filter, light incident from the specimen 9 separately from the light that becomes noise such as illumination light, to thus capture an image of the specimen 9. Image data obtained by the imaging is sent to the image processor 60 as microscopic image data of the first microscope 30.

The second microscope 40, which includes the second illumination/imaging unit 41, the optical system 20, and the stage system 10, is configured to capture an image of the specimen 9 by the second microscopy. In the first embodiment, SIM is employed as the second microscopy, as described above. In the SIM, a non-illustrated laser light source of the second illumination/imaging unit 41 is caused to generate a structured illumination (i.e., a patterned illumination) to illuminate the specimen 9, and a non-illustrated imaging element of the second illumination/imaging unit 41 is caused to capture an image of a moiré occurring due to the fine structure of the specimen 9 and the structured illumination. In this case, by changing the orientation of the pattern of structured illumination to acquire a plurality of images, the image component (low frequency component) obtained within the diffraction limit is caused to be separated from the component (high frequency component) exceeding the diffraction limit that has been read in the form of the moiré. The low frequency component and the high-frequency component are rearranged in the Fourier-transformed frequency space and then these components are inverse Fourier transformed, thus generating an image with a resolution exceeding the diffraction limit. The specimen 9 is further displaced relative to the focal plane 20a in the Z-axis direction to capture images of different planes within the specimen 9. More specifically, images of the specimen 9 are captured by scanning of the specimen 9 at a plurality of Z positions, to thus generate a Z-stack image. The second microscope 40 can perform a highly resolved observation of the specimen 9, but at a relatively low speed.

The second illumination/imaging unit 41 is configured to illuminate the specimen 9 and to then detect light from the specimen 9. The second illumination/imaging unit 41 is configured to generate illumination light, for example, illumination light having a wavelength of $\lambda_2$ (e.g., 561 nm) in accordance with the illumination conditions, and to emit the generated illumination light toward the optical system 20 (the filter 24) through a filter, such as a non-illustrated dichroic mirror. The illumination light is sent to the specimen 9 through the optical system 20, and illuminates the observation position 9a within the specimen 9 located on the focal plane 20a. This allows light, such as, for example, fluorescence with a wavelength of $\lambda_2'$ (e.g., 600 nm) emitted from the specimen 9 to return to the second illumination/imaging unit 41 through the optical system 20. The second illumination/imaging unit 41 is configured to detect, with the above-described non-illustrated filter, light incident from the specimen 9 separately from the light that becomes noise such as illumination light, to thus capture an image of the specimen 9. Image data obtained by the imaging is sent to the image processor 60 as microscopic image data of the second microscope 40.

The controller 50, which includes an input unit 51, is configured to control each of the components of the body 99, more specifically, the stage system 10, the optical system 20, the first microscope 30, and the second microscope 40, in accordance with instructions that are input to the input unit 51. The controller 50 allows an information processing device including a computer, a microcontroller, or the like to execute control programs stored on a storage device such as a non-volatile memory or a storage medium such as a CD-ROM, to thus realize each of the functional units to function as a controller.

For example, the controller 50 controls the stage system 10 in accordance with an instruction to change the Z position of the specimen 9 of which an image is to be captured, and drives the stage 11 for supporting the specimen 9 in a direction in parallel with the optical axis L (also referred to as optical-axis direction) to move the desired Z position of the specimen 9 onto the focal plane 20a. The controller 50 controls the first and second illumination/imaging units 31 and 41 to cause an image of the specimen 9 to be captured.

The input unit 51 includes a mouse, a keyboard, a touch panel, and the like. The user can instruct, by way of the input unit 51, the controller 50 to perform observation with a microscope (also simply referred to as microscopic observation), that is, the imaging of the specimen 9 by the first and second microscopes 30 and 40. Moreover, the user can instruct, by way of the input unit 51, a generation of new image data processed of microscopic image data obtained by setting the observation conditions, and microscopic observation.

The image processor 60 is configured to process the microscopic image data obtained by the first and second microscopes 30 and 40, or to generate new image data. The image processor 60 includes an image generator 61 and an image output unit 62. The image processor 60 allows an information processor including a computer, a microcontroller, or the like to execute image processing programs stored on a storage device such as a non-volatile memory or a storage medium such as a CD-ROM, to thus realize each of the functional units to function as an image processor.

Note that, since the image processor 60 handles the captured images, as data, of which images have been captured by the first and second microscopes 30 and 40, the data are also referred to as microscopic image data below or in the embodiments to be described later, however, since the microscopic image data indicates information by an image, there may be a case in which the same reference numerals is used for the data as well as the image, and the data is occasionally illustrated as an image. The microscopic image data of the first and second microscopes 30 and 40 is data corresponding to a single piece of microscopic image.

The image generator 61 is configured to generate new image data on the basis of microscopic image data obtained by the first and second microscopes 30 and 40. In this case, the image generator 61 generates corresponding image data corresponding to first microscopic image data obtained by the first microscope 30 under the first observation condition, on the basis of second microscopic image data and third microscopic image data obtained by the second microscope 40 under the second observation condition. The image generator 61 is configured to store the first, second, and third microscopic image data received from the first and second microscopes 30 and 40, as well as corresponding image data that has been generated. The generation of corresponding image data by the image generator 61 will be described later. Each of the first, second, and third microscopic image data are data corresponding to a single piece of microscopic image.

The image output unit 62 is configured to process the first, second, and third microscopic image data obtained by the first and second microscopes 30 and 40 and/or corresponding image data generated by the image generator 61, and to output the processed image data to a display 63. This allows the display 63 to display, at least, a microscopic image based on the first microscopic image data obtained by the first microscope 30 under the first observation condition, and a corresponding image based on the corresponding image data generated on the basis of the second and third microscopic image data obtained by the second microscope 40 under the second observation condition in correspondence to the microscopic image.

The display 63 includes a display such as a CRT, a liquid crystal display, a plasma display, an organic EL display, and a projector. The display 63 is configured to display, on the screen, image data processed by the image output unit 62, more specifically, at least one of a microscopic image based on the first, second, and third microscopic image data (also referred to as captured image) obtained by the first and second microscopes 30 and 40, and a corresponding image based on corresponding image data generated by the image generator 61.

The display 63 is also configured to display a corresponding image based on the corresponding image data generated by the image generator 61 in a manner distinguished from the captured image based on the first, second, and third microscopic image data obtained by the first and second microscopes 30 and 40. Here, the image output unit 62 distinguishes the corresponding image from the captured image by, for example, thickening, blinking, changing coloration, or the like of the outer frame surrounding the corresponding image. This allows the generated image and the captured image to be distinguished from each other.

Figure 3:
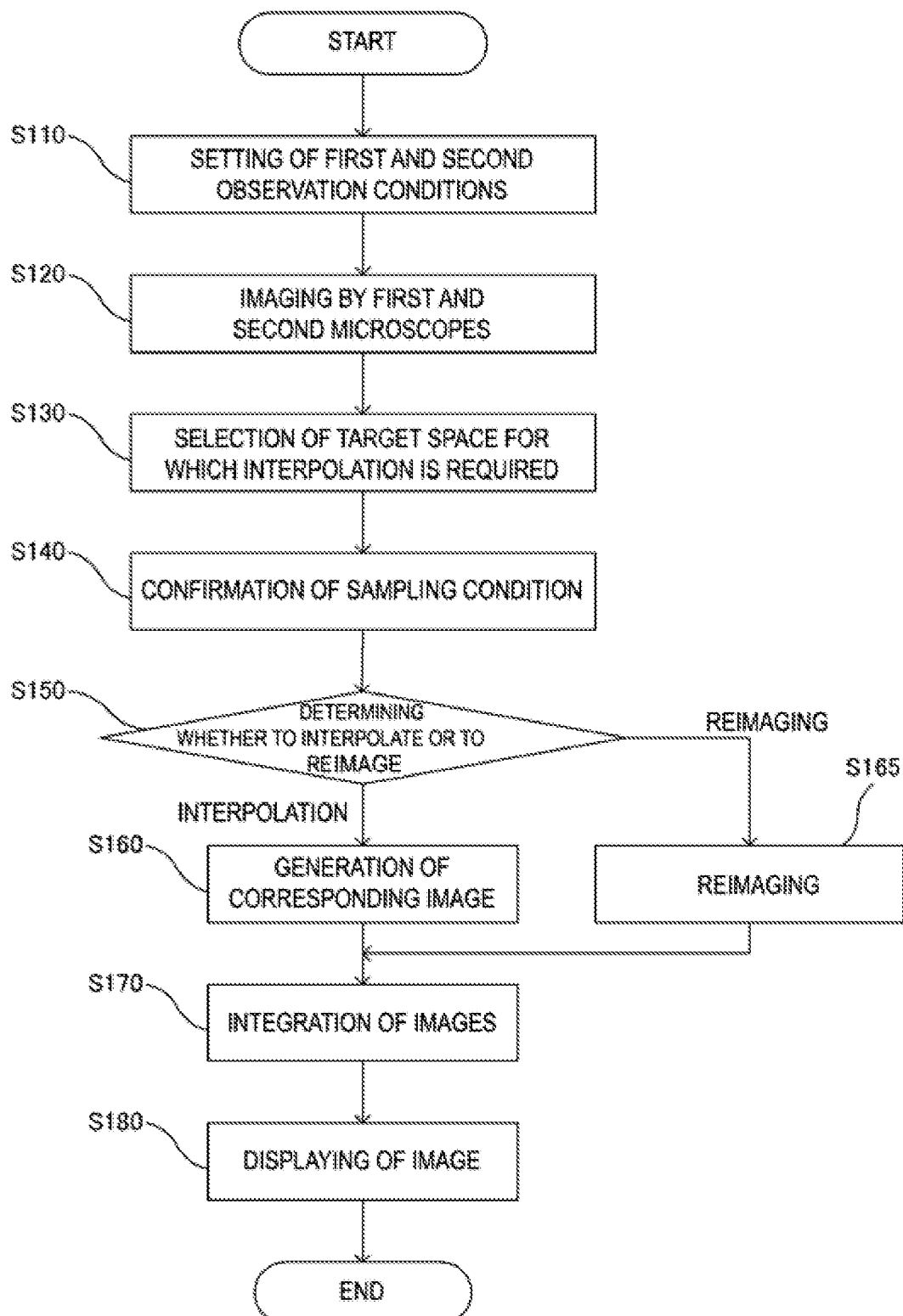
FIG. 3 illustrates a flow of a microscopic observation and an image processing according to the first embodiment.

FIG. 3 illustrates a flow of a microscopic observation and an image processing according to the first embodiment. In this example, a Z-stack image of the specimen 9 is captured.

In step 110, the user sets the first and second observation conditions. The first microscopy and the second microscopy among the first and second observation conditions have already been set in the first embodiment, as described above. Further, as an example of the illumination conditions of the first observation condition, using of illumination light having a wavelength of 488 nm is set. Moreover, as an example of the imaging conditions of the first observation condition, there are set, using of the objective lens 21a with a numerical aperture of 1.49, a range within the XY plane in which imaging or image-capturing is performed (i.e., the XY scanning range), and a Z position at which an image is captured. The Z position at which the imaging of the specimen 9 is performed is set with a reference position $Z_1$ on the Z-axis in capturing images of the specimen 9, a step amount $\Delta Z_1$ in the Z direction, and the number $N_1$ of images to be captured. Further, as an example of the illumination conditions of the second observation condition, using of light having a wavelength of 561 nm is set. Moreover, as an example of the imaging conditions of the second observation condition, there are set, using of the objective lens 21a having the numerical aperture of 1.49, which is the same as in the first observation condition, a range within the XY plane in which imaging is performed, a reference position $Z_2$ on the Z-axis in imaging, a step amount $\Delta Z_2$ in the Z direction, and the number $N_2$ of images to be captured. The user inputs the observation conditions by way of the input unit 51, and the input conditions are sent to the controller 50. Moreover, in the following descriptions, the imaging conditions are to be set such that $Z_1=Z_2$, $\Delta Z_1=\Delta Z_2/2$, and $N_1=2N_2$, as an example. Note that the above-described imaging conditions are an example for description, and may not be set such that $Z_1=Z_2$, may not be set such that $\Delta Z_1=\Delta Z_2/2$, and may not be set such that $N_1=2N_2$.

When the user causes the specimen 9 to be supported on the stage 11 and instructs the initiation of microscopic observation by way of the input unit 51, the process proceeds to the next step 120.

In step 120, images of the specimen 9 are concurrently captured by the first and second microscopes 30 and 40.

The controller 50 controls the stage system 10, the optical system 20, and the first and second microscopes 30 and 40, in accordance with the first and second observation conditions respective of the first and second microscopes 30 and 40. For example, the controller 50 sets the illumination conditions respective of the first and second illumination/imaging units 31 and 41.

The controller 50 drives the stage 11 so that the focal plane 20a of the optical system 20 may be located at a Z position $Z_1$ of the specimen 9, and causes the first and second microscopes 30 and 40 to capture images of the specimen 9.

As illustrated in FIG. 1, the first microscope 30 causes the first illumination/imaging unit 31 to emit illumination light having a wavelength of $\lambda_1$, to thus illuminate the specimen 9 on the stage 11 through the optical system 20. The observation position 9a of the specimen 9 located on the focal point is illuminated, to thus cause fluorescent dyes contained in the specimen 9 to emit fluorescence with a wavelength of $\lambda_1'$. The fluorescence is converged through the optical system 20 and is imaged by the first illumination/imaging unit 31.

In parallel with the illumination of the specimen 9 and the imaging of fluorescence by the first microscope 30, the controller 50 controls the scanner 23 to cause the illumination light to swing in the XY direction, to thus perform scanning of the specimen 9 within the XY scanning range on the focal plane 20a. This allows the first microscope 30 to capture an image of the Z position $Z_1$ of the specimen 9, thus generating image data of the confocal microscopy. The image data at the Z position $Z_1$ are sent to the image processor 60, and are stored on the image generator 61 as the first microscopic image data.

While, the second microscope 40 causes the second illumination/imaging unit 41 to emit the structured illumination having a wavelength of $\lambda_2$, to thus illuminate the specimen 9 on the stage 11 through the optical system 20. This allows the observation position 9a of the specimen 9 located on the focal point to be illuminated, to cause other fluorescent dyes included in the specimen 9 to emit fluorescence with a wavelength of $\lambda_2'$. The fluorescence is converged through the optical system 20, and is imaged by the second illumination/imaging unit 41. The microscopy of the second microscope 40, which is SIM, allows the orientation of the pattern of the structured illumination to be changed to cause images of a plurality of the specimens 9 to be captured, to thus generate a SIM image of the specimen 9 at the Z position $Z_1$. The data of the SIM image at the Z position $Z_1$ is stored on the image generator 61 as microscopic image data of the second microscope 40. When the second microscope 40 performs imaging, the scanner 23 is caused to be retracted from the optical axis L.

Upon completion of the imaging of the specimen 9 at the Z position $Z_1$, the controller 50 step-drives the stage 11 by $\Delta Z_1$ to cause the first microscope 30 alone to capture an image of a cross-section of the specimen 9 located on the focal plane 20a.

Upon completion of the imaging of the specimen 9 at the Z position $Z_1+\Delta Z_1$, the controller 50 further step-drives the stage 11 by $\Delta Z_1$ to cause a Z position $Z_1+2\Delta Z_1$ ($=Z_2+\Delta Z_2$) of the specimen 9 to be located on the focal plane 20a, and causes the first and second microscopes 30 and 40 to capture images of the specimen 9.

The controller 50 sequentially step-drives the stage 11 in the Z-axis direction by a step amount $\Delta Z_1$, and causes both the first and second microscopes 30 and 40 or the first microscope 30 alone to capture images of a plurality of Z positions within the specimen 9, while causing the specimen 9 to be scanned on the focal plane 20a. The first microscope 30 generates a plurality of confocal microscopic images from a series of imaging results, and causes the confocal microscopic images to be sent, as microscopic image data of the first microscope 30, to the image processor 60. While, the second microscope 40 generates a plurality of SIM images from the series of imaging results, and causes the SIM images to be sent, as a plurality of microscopic image data of the second microscope 40, to the image processor 60. The plurality of microscopic images generated from the series of imaging results are also referred to as Z-stack image in a collective manner.

Figure 4:
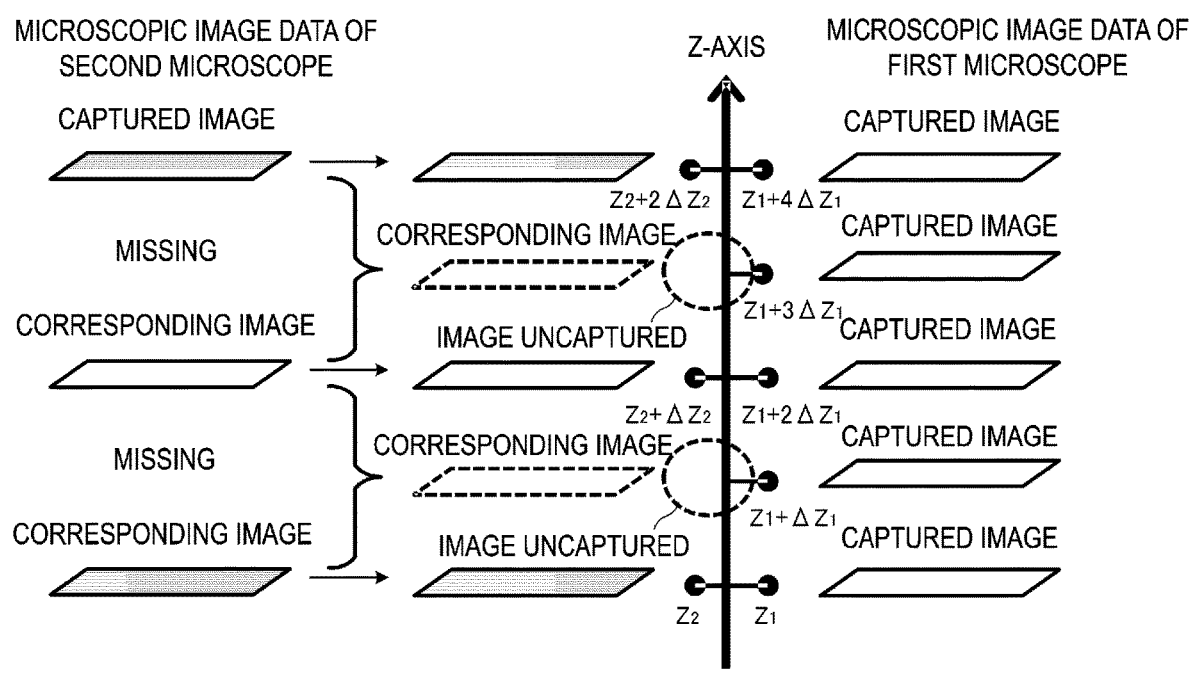
FIG. 4 illustrates an example of correspondences of captured images based on first and second microscopic image data.

FIG. 4 illustrates an example of correspondences of the captured images based on a plurality of microscopic image data obtained by each of the first and second microscopes 30 and 40. Here, due to the difference in the first and second observation conditions (in particular, the imaging conditions), imaging is not performed by the second microscope 40 at some of the Z positions (in the example of FIG. 4, at the Z positions $Z_1+\Delta Z_1$, $Z_1+3\Delta Z_1$, and the like), and microscopic images comparable with the microscopic images of the first microscope 30 are not present.

In step 130, the user selects a target space being a spatial site to generate corresponding image data by interpolation. The target space can be given by the Z position of the specimen 9. In step 130, first, the image processor 60 processes the microscopic image data obtained by each of the first and second microscopes 30 and 40, and causes a list of the captured images contained in each of the microscopic image data to be displayed on the screen of the display 63. The user recognizes, from the display on the screen, that no microscopic images of the second microscope 40 are present at the Z positions $Z_1+\Delta Z_1$ and $Z_3+3\Delta Z_3$ at which microscopic images of the first microscope 30 are present. The user inputs, by way of the input unit 51, a numerical value at the Z position of the specimen 9, or clicks, touches, or the like a point on the screen indicating the Z position, for example, to select the target space. Herein, it is assumed that the Z position $Z_1+\Delta Z_1$ is selected as the target space.

When the user selects the Z position $Z_1+\Delta Z_1$, the microscopic image data at the Z position $Z_1+\Delta Z_1$ among the plurality of microscopic image data of the first microscope 30 is specified as the first microscopic image data. Moreover, from among the plurality of microscopic data of the second microscope 40, the second microscopic image data and the third microscopic image data that are to be used to generate corresponding image data are specified. For example, among the plurality of microscopic image data of the second microscope 40, the microscopic image data closest to the Z position $Z_1+\Delta Z_1$ in the ±Z directions are specified as the second microscopic image data and the third microscopic image data. This allows for a generation of a corresponding image at the Z position identical to the Z position of the first microscopic image data, as described below, in correspondence to the first microscopic image data being the microscopic image data on a first plane (at the Z position $Z_1+\Delta Z_1$) among the microscopic image data of the first microscope 30, from the second microscopic image data obtained on a second plane and the third microscopic image data obtained on a third plane, where the planes interpose the first plane in between, among the microscopic image data of the second microscope 40.

In step 140, the image processor 60 confirms sampling condition for the target space that has been selected in step 130, and then evaluates whether corresponding image data for the target space can be generated by interpolation.

The sampling condition includes, at least, the following conditions related to the interval between the Z positions at which, at least, two different captured images based on the microscopic image data are captured, that is, the step amount $\Delta Z$ in the optical-axis direction.

Equation (1)

$$\Delta Z < \frac{1}{2k_{z,\,max}} \quad (1)$$

Here, a cutoff frequency $k_{z,\,max}$ is a maximum range in which the optical transfer function (OTF) of the optical system 20 extends in a conjugated frequency direction with respect to the optical-axis direction. If the interpolation is performed using image data that fail to satisfy the sampling condition, aliasing may occur.

The image processor 60 causes details of the sampling condition (Equation (1)), more specifically, a value of each of the step amount $\Delta Z$ and the cutoff frequency $k_{z,\,max}$, a distinction whether the sampling condition is met, a possibility of an occurrence of the aliasing if the condition is not met, a degree of the possibility of the occurrence, and the like to be displayed on the screen of the display 63. This allows the user to confirm whether the sampling condition is met, and to avoid the occurrence of the aliasing when, for example, the sampling condition is not met.

In step 150, the user determines whether to generate the image data for the target space by interpolation or by reimaging or image-recapturing. The user selects, by way of the input unit 51, either the interpolation or the reimaging on the basis of the sampling condition that has been confirmed in step 140. The user can select the interpolation when, for example, the sampling condition is met, while the user can select the reimaging when the sampling condition is not met. The user can also select the interpolation even when the sampling condition is not met. When the interpolation is selected, the image processor 60 receives the instruction, and the process proceeds to step 160. When the reimaging is selected, the controller 50 receives the instruction, and the process proceeds to step 165.

In step 160, the image generator 61 generates, by interpolation, corresponding image data for the target space.

Figure 5:
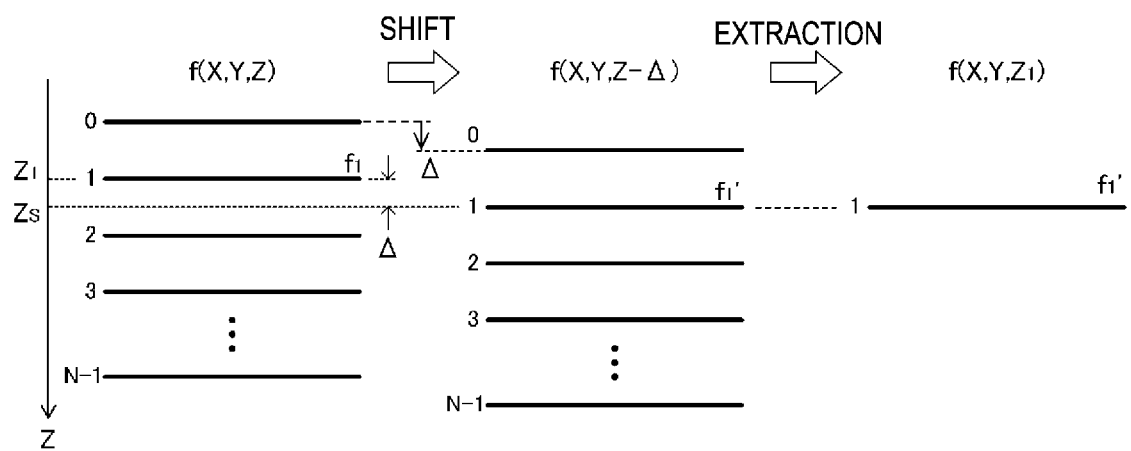
FIG. 5 illustrates a principle of generating image data using Fourier transform.

FIG. 5 illustrates a principle of generating corresponding image data using Fourier transform. The microscopic image data f include N pieces of captured images captured at mutually different Z positions $Z_i$ (i=0 to N−1), as illustrated on the left in FIG. 5. The microscopic image data f are a set of luminance values related to discrete X, Y, Z coordinates, but are expressed as a function related to coordinate X, Y, Z, for the sake of convenience. In the present example, the Z position $Z_S$ (=$Z_1+\Delta$) of the target space is set.

The image generator 61 determines a shift amount $\Delta$ for the target space that has been selected in step 130. Here, the shift amount $\Delta$ is the difference between the Z position $Z_S$ of the target space and the Z position at which an image of any one of the N pieces of captured images based on the microscopic image data f is captured. As the image of any one of the N pieces of captured images, the captured image $f_1$ captured at the Z position $Z_1$ closest to the Z position $Z_S$ may be selected, for example. In such a case, the shift amount is determined such that $Z_S-Z_1=\Delta$.

The image generator 61 generates image data for the target space using the shift amount $\Delta$ thus determined. First, the image generator 61 calculates a discrete Fourier transform F related to the Z coordinate of the microscopic image data f.

[Equation (2)]

$$F(X, Y, K) = \sum_{Z=0}^{N-1} f(X, Y, Z)\exp\left(-i\frac{2\pi}{N}KZ\right) \quad (2)$$

where, K is a variable conjugated to the coordinate Z, which is made discrete as $K_i=i\Delta K$ (i=0 to N−1) using $\Delta K=/\Delta Z$. Note that N may be the total number of captured images included in the microscopic image data f, and may be two or more images that satisfy the sampling condition (Equation (1)) among all of the captured images. Next, the image generator 61 calculates the inverse discrete Fourier transform f using a phase factor $(2\pi/N)K(Z-\Delta)$ involving the shift amount Δ with respect to the Z coordinate.

[Equation (3)]

$$f(X, Y, Z-\Delta) = \frac{1}{N}\sum_{K=0}^{N-1} F(X, Y, K)\exp\left(i\frac{2\pi}{N}K(Z-\Delta)\right) \quad (3)$$

A calculation of Equation (3) generates new microscopic image data f (X, Y, Z−Δ) with a shift of Δ in the Z position, as illustrated in the middle of FIG. 5. Lastly, the image generator 61 extracts image data $f_1'$ for the Z position $Z_S$ from among the microscopic image data thus generated. This provides corresponding image data for the target space.

The corresponding image data are an example of image data corresponding to the first microscopic image data in that the Z position thereof is the same as the first microscopic image data at the Z position $Z_1+\Delta Z_1$ of the specimen 9. Moreover, as is apparent from Equations (2) and (3), the corresponding image data are generated on the basis of the second microscopic image data, which are image data captured at a Z position different from the Z position $Z_1+\Delta Z_1$, and the third microscopic image data, which are image data captured at another Z position. Here, assuming that the first microscopic image data obtained at the Z position $Z_1+\Delta Z_1$ of the specimen 9 is described as the first microscopic image data obtained on the first plane, the corresponding image data may be referred to as being generated on the basis of the second microscopic image data obtained on the second plane that is different from the first plane of the specimen 9, and the third microscopic image data obtained on the third plane that is different from the first and second planes. Moreover, the corresponding image data are generated on the basis of the second and third microscopic image data provided such that the first plane is between the second plane and the third plane.

In step 165, the controller 50 generates image data for the target space by reimaging. The controller 50 sets the observation conditions for the reimaging. The controller 50 causes the second microscope 40 to capture an image of the specimen 9 at the Z position $Z_S$. The details are the same as in the previous step 120. The obtained corresponding image data are sent to the image processor 60.

In step 170, the image output unit 62 integrates the corresponding image data generated by the image generator 61 in step 160 or the image data generated by reimaging in step 165 into the microscopic image data generated in step 120, to thus compile the integrated data into a series of Z stack images.

In step 180, the display 63 displays, on the screen, the Z stack images complied in step 170.

Figure 6:
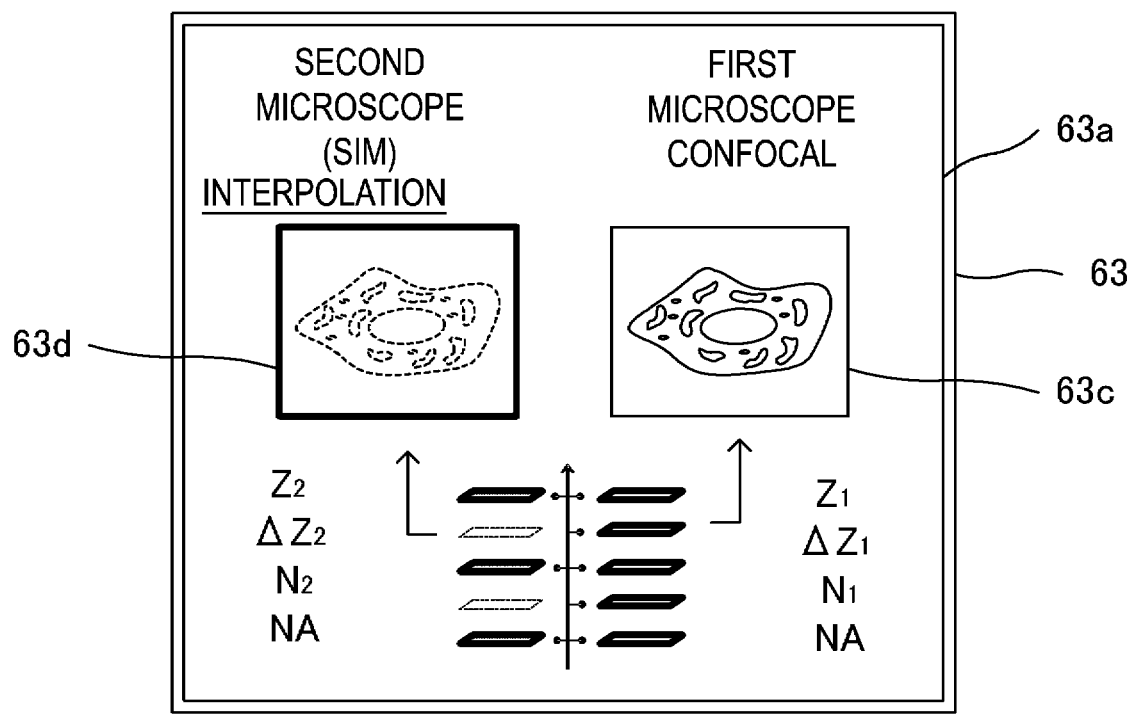
FIG. 6 illustrates an example of a display screen in which a Z-stack image is displayed.

FIG. 6 illustrates an example of a display screen 63a of the display 63 that displays the Z stack images obtained by each of the first and second microscopes 30 and 40. The display 63 displays the first and second microscopes and microscopies in the top row of the display screen 63a, each one of images 63c and 63d among the Z stack images obtained by each of the microscopes in the middle row, and information related to the Z-stack images (image positions $Z_1$ and $Z_2$, Z intervals $\Delta Z_1$ and $\Delta Z_2$, image numbers $N_1$ and $N_2$, numerical aperture NA, and the like) in the bottom row. The display 63 displays a corresponding image 63d generated by interpolation by the image generator 61, and integrated into the microscopic image data in a manner visually distinguished from a captured image, for example, the image 63c. In the present example, the outer frame surrounding the corresponding image 63d is thickly displayed, and a character "interpolation" is displayed, which represents a generation by interpolation in the vicinity of the corresponding image 63d.

As described above, when an image of the specimen is captured under the first and second observation conditions using the first and second microscopes 30 and 40, for a cross-section of the specimen, of which the image is captured under one observation condition, the image of the cross-section may not be captured under the other observation condition. The reason for the above may lie in, for example, that the time for discoloration differs between the fluorescent dyes for the first observation condition and the fluorescent dyes for the second observation condition, and the number of images that can be captured until the discoloration differs. The reason for the above may also lie in that when the wavelength at which multicolored fluorescent dyes are excited differs between the first and second observation conditions, the magnitude of damage to a specimen differs even for the same duration of time for imaging, and thus, the number of images that can be captured is differentiated in view of the magnitude of the total damage to the specimen. The reason for the above may further lie in that, even if the same fluorescent dyes and the same excitation wavelength are used, when a long duration of time is required for the imaging due to the microscopy or the like, the discoloration of the fluorescent dyes and the damage to the specimen may become large, and thus, the number of images that can be captured may be limited. The microscope system 100 according to the first embodiment allows a corresponding image corresponding to one microscopic image data to be generated from the other microscopic image data to perform interpolation, even in a case where, for one observation condition, microscopic image data corresponding to the microscopic image data of a Z position of a specimen in the other observation condition are not present, as described above. This enables an easy comparison between the microscopic images obtained under different observation conditions.

In the microscope system 100 according to the first embodiment, an image processing is performed to generate image data corresponding to microscopic image data obtained by the first microscope 30 of a confocal microscopy with a relatively low resolution, on the basis of microscopic image data obtained by the second microscope 40 of a SIM with a high resolution. Since a microscopy with a high resolution generally requires an observation for a long period of time, there may be a case in which, due to a discoloration or the like of the above-described fluorescent dyes, an imaging is performed by the first microscope 30 at a Z position of the specimen 9, while an imaging is not performed by the second microscope 40. In such a case as well, generating a corresponding image from the microscopic image data obtained by the second microscope 40 to perform an interpolation enables an easy comparison between the microscopic images obtained from the first and second microscopes 30 and 40.

Note that, in the microscope system 100 according to the first embodiment, an image processing is performed to generate image data corresponding to the microscopic image data obtained by the first microscope 30 on the basis of the microscopic image data obtained by the second microscope 40, however, alternatively or in conjunction with the above, corresponding image data corresponding to the microscopic image data obtained by the second microscope 40 may be generated on the basis of the microscopic image data obtained by the first microscope 30. For example, a long period of time may be required, even when an imaging is performed with a microscopy having a low resolution, such as, for example, in a case where an illumination of a long period of time is required when using fluorescent dyes that emit weak fluorescence. Accordingly, there may be a case in which imaging is performed, at a Z position of the specimen 9, by the second microscope 40 having a high resolution, while an imaging by the first microscope 30 having a low resolution is not performed. In such a case, generating a corresponding image from the microscopic image data obtained by the first microscope 30 to perform an interpolation enables an easy comparison between the microscopic images obtained by the first and second microscopes 30 and 40.

Note that a plurality of objective lenses may also be provided in the microscope system 100, whereby an objective lens may be replaced between the first observation condition and the second observation condition. Further, the microscope system 100 according to the first embodiment shares the stage 11 and a part of the optical system 20 between the first and second microscopes 30 and 40, however, alternatively, each of the first and second microscopes 30 and 40 may have an individual stage and an optical system as dedicated components. In such a case, a marker may be provided, in proximity to the specimen, on the holding member 8 for holding a specimen, where images of the specimen can be captured for a range equal to each other by determining the position of the specimen relative to the marker in observing the specimen with each of the microscopes.

Note that, under the microscopic observation of the microscope system 100 according to the first embodiment, the sampling condition (Equation (1)) is confirmed to evaluate whether the corresponding image data can be generated by interpolation in step 140, however, alternatively, it may be confirmed whether both of the following two interpolation conditions are met. The first condition is that the Z position of the specimen 9 corresponding to the target space is located between the Z positions at which at least two different captured images are captured, among the image data based on the microscopic image data. The second condition is that the Z position of the specimen 9, which corresponds to the target space, is included within a predetermined range from the Z position at which each of at least two different captured images is captured, for example, within the range of the focal depth of the objective lens used in the imaging. In case when the interpolation conditions are met, an interpolation is performed using image data corresponding to at least two different captured images in the methods of the first embodiment, where a suitable corresponding image data in which the image of the specimen 9 is reflected in the target space incorporated into the captured image can be reproduced. Note that when an interpolation is performed using image data that does not satisfy the interpolation conditions, the image of the specimen 9 in the target space, which is to be extracted, has not been incorporated into the captured image, and thus, corresponding image data containing noise, which is significantly different from the image of the original specimen, may be generated.

Note that, under the microscopic observation of the microscope system 100 according to the first embodiment, the user determines, in step 150, whether to generate the corresponding image data by interpolation or by reimaging, however, alternatively, the determination may be done by the image generator 61. The image processor 60 may select the interpolation when, for example, the sampling condition [Equation (1)] is met, while the image processor 60 may select the reimaging when the sampling condition is not met.

Note that, under the microscopic observation using the microscope system 100 according to the first embodiment, the shift amount Δ is known in generating the corresponding image data in step 160, however, the shift amount Δ may be unknown because the reference positions $Z_1$ and $Z_2$ in the optical-axis direction are unknown in the first, second, and third microscopic image data g and f. In such a case, in step 160, the shift amount Δ is firstly calculated. However, it is assumed that Z intervals $\Delta Z_1$ and $\Delta Z_2$ are known in each of the image data. The Z intervals $\Delta Z_1$ and $\Delta Z_2$ may not be equal to each other.

Figure 7:
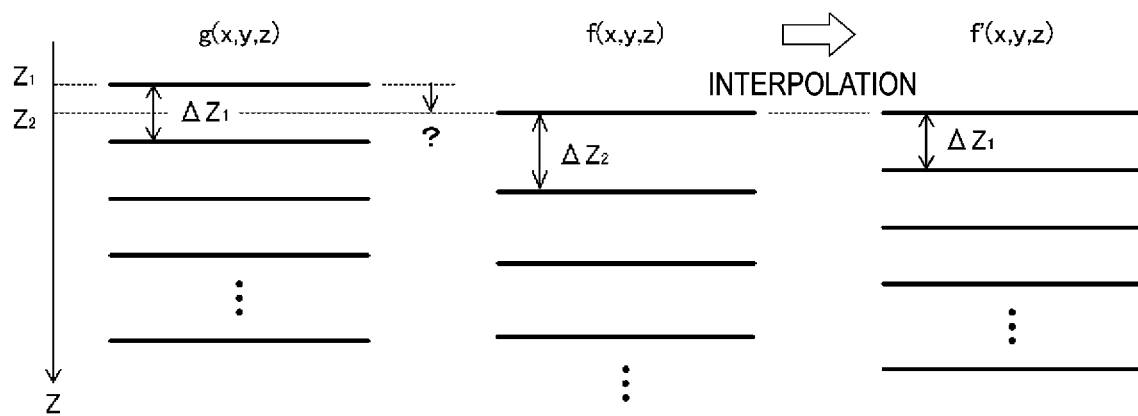
FIG. 7 illustrates an estimation of a shift amount of image data.

FIG. 7 illustrates an estimation of the shift amount Δ using the first microscopic image data g and the second and third microscopic image data f, as an example. First, the image generator 61 converts the Z interval $\Delta Z_2$ of each of the images based on the second and third microscopic image data f into $\Delta Z_1$, to thus generate new microscopic image data f'. Here, the image generator 61 utilizes the Fourier transform [Equation (2) and Equation (3)] as described above to each extract the image data for the Z positions $Z_2 + i\Delta Z_1$ (i=0 to N−1) from the second and third microscopic image data f, and formulates new microscopic image data f with the Z interval $\Delta Z_1$ from the N pieces of images that have been extracted. Next, the image generator 61 calculates the correlation coefficient ρ(Δ) related to the shift amount Δ by shifting the image data f' by the shift amount Δ with respect to the Z coordinate, using the Fourier transform [Equation (2) and Equation (3)]

[Equation (4)]

$$\rho(\Delta) = \frac{E[(g(X,Y,Z) - E[g(X,Y,Z)])(f'(X,Y,Z-\Delta) - E[f'(X,Y,Z-\Delta)])]}{(E[(g(X,Y,Z) - E[g(X,Y,Z)])^2]E[(f'(X,Y,Z-\Delta) - E[f'(X,Y,Z-\Delta)])^2])^{1/2}} \quad (4)$$

where E(f) is the average value of the fs. Lastly, the image generator 61 estimates the objective shift amount from the Δ by which the correlation coefficient ρ(Δ) becomes maximum. The image generator 61 can generate corresponding image data by calculating the Fourier transform [Equation (2)] including the second and third microscopic image data f and the inverse Fourier transform [Equation (3)] including the phase factor involving the shift amount Δ as aforementioned, using the estimated shift amount Δ, and extracting image data from the inverse Fourier transform.

According to the method of estimating the shift amount, the corresponding image data can be generated even in a case when the shift amount Δ is unknown. Thus, a corresponding image corresponding to one microscopic image can be generated from the other microscopic image data to perform the interpolation even when the shift amount Δ is unknown, enabling an easy comparison between the microscopic images obtained under different observation conditions. Note that in addition to the second and third microscopic image data, other microscopic image data of the second microscope 40 may also be used in conjunction therewith.

Note that, under the microscopic observation using the microscope system 100 according to the first embodiment, the corresponding image data are to be generated by the discrete Fourier transform in step 160, however, alternatively, corresponding image data may be generated by weighted average or fast multipole method.

Figure 8:
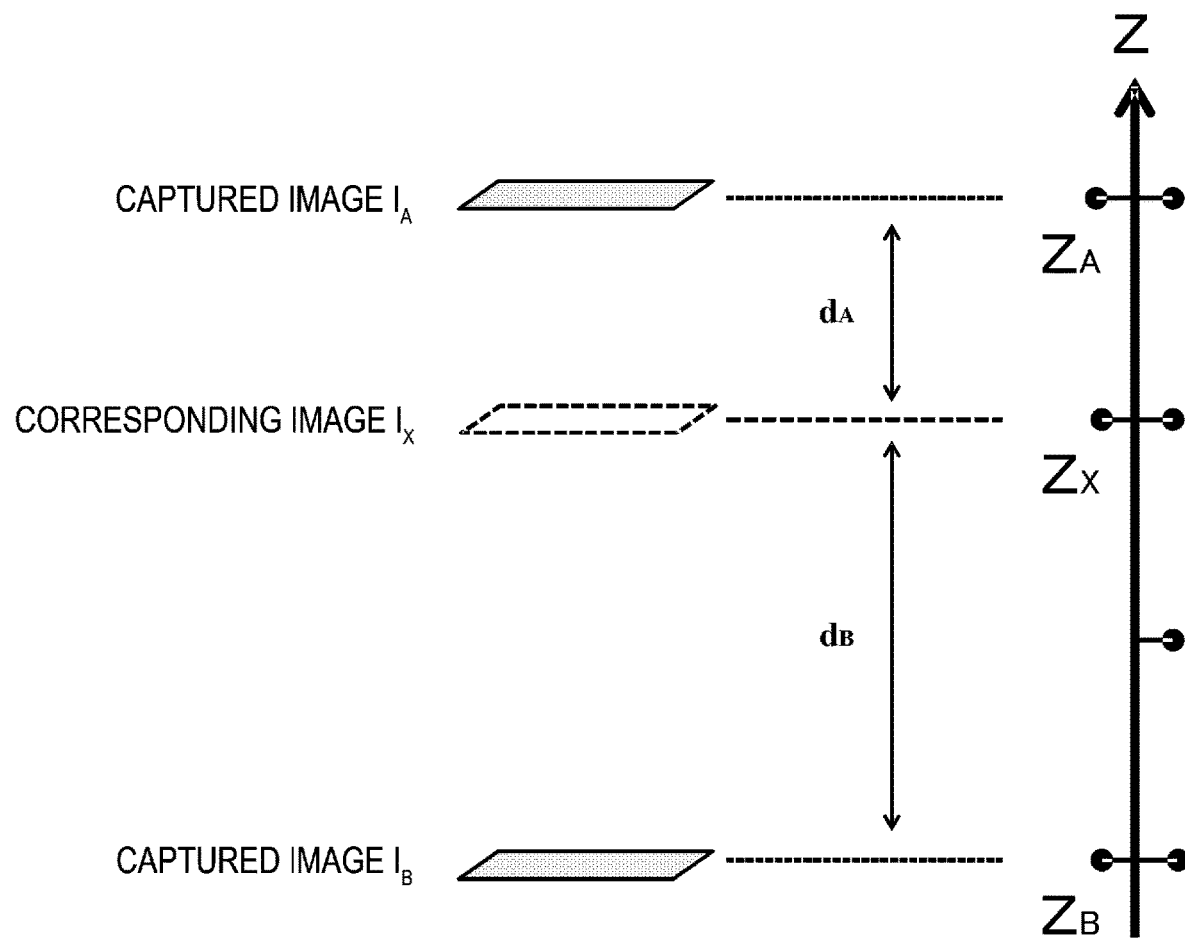
FIG. 8 illustrates a principle of generating image data using weighted average.

FIG. 8 illustrates a principle of generating corresponding image data using weighted average. Here, the second and third microscopic image data are image data $I_A$ and $I_B$ of first and second positions $Z_A$ and $Z_B$ that include a position $Z_X$ of image data Ix in between. Here, $d_A = Z_A - Z_X$ and $d_B = Z_X - Z_B$. The image generator 61 calculates the image data $I_A$ and $I_B$ to generate corresponding image data $I_X = c_A I_A + c_B I_B$. Here, $c_A$ and $c_B$ are weights and are given as $c_A = d_B/(d_A + d_B)$ and $c_B = d_A/(d_A + d_B)$. The corresponding image data can be generated in a simple manner using the weighted average.

In the fast multipole method, the corresponding image data are generated by estimating, as an intensity value, a superposition of the coulombic potential generated by each of the electric charges at each of the positions, on the two-dimensional plane, corresponding to each of the pixels of the image, assuming that there exists, at a position on a two-dimensional plane corresponding to each of the pixels of the captured image, an electric charge equal to the intensity value of each of the pixels, on the basis of the second and third microscopic image data. The fast multipole method can also be applied in a case when the sampling condition is not met, in addition to in a case when the sampling condition is met without being limited thereto.

Note that, in a case where the corresponding image data are to be generated by discrete Fourier transform in step 130, the above-described weighted average, or the above-described fast multipole method, it does not necessarily need to satisfy the first condition in the interpolation conditions, which is, that the target space is located between the Z positions of the specimens 9, at which at least two different captured images to be used for the interpolation are captured. That is, at least two different captured images may be extrapolated into the positions outside of the Z positions of the specimen 9, at which the respective captured images are captured, to thus generate corresponding image data.

Note that under the microscopic observation using the microscope system 100 according to the first embodiment, the user can select, in step 150, the reimaging in a case where the specimen 9 is reusable, such as in a case where the specimen 9 is a fixed specimen, for example. Here, when the user selects, in step 150, the reimaging despite the unavailability of reuse of the specimen 9, the reimaging may not be performed in step 165, and the process may proceed to the next step 170. Additionally, in step 150, the display 63 may display the unavailability of reuse of the specimen 9 to indicate the user to select the interpolation.

In the first embodiment, corresponding image data at a Z position identical to the Z position of the first microscopic image data specified in the above-described step 130 is generated. However, the Z position of the corresponding image data may not be identical to the Z position of the first microscopic image data, and, for example, the Z position of the corresponding image data may be different from the Z position of the first microscopic image data in a range that does not interfere with the comparison between the image based on the first microscopic image data and an image based on comparison image data. That is, the corresponding image data can be corresponding to the first microscopic image data, also in a case where the Z positions are mutually different in a range that does not interfere with the comparison between the image based on the first microscopic image data and the image based on the comparison image data, not in a case where the Z position of the corresponding image data is identical to the Z position of the first microscopic image data.

A second embodiment of the present disclosure will now be described.

In the second embodiment, the first microscope 30 employs a confocal microscopy as a first observation condition (first microscopy), and the second microscope 40 employs a localization method as a second observation condition (second microscopy). In the localization method, the fluorescent dyes introduced into the specimen 9 are caused to be activated at a low density and to be then irradiated with excited light, thereby causing the fluorescent dyes in the activated state alone (some of the fluorescent dyes alone) to emit light to obtain a fluorescent image. In the fluorescent image, the images of the fluorescent dyes that emit light at a low density are individually separated, thereby specifying the positions of the individual fluorescent dyes. Generating dotted images by repetitively performing the above-described activation, excitation, fluorescence image acquisition, and location identification to assign specific luminance values to the positions of the specified plurality of fluorescent dyes leads to a generation of a high-resolution image exceeding the optical diffraction limit. Note that the localization method includes, for example, stochastic optical reconstruction microscopy (STORM) and photoactivated localization microscopy (PALM). In the second embodiment, a three-dimensional STORM is employed as an example, and the fluorescence image generated by STORM is also referred to as STORM image.

However, because STORM is employed as the microscopy of the second microscope 40, the body 99 includes an optical system 20' in place of the optical system 20 according to the first embodiment. Other configurations included in the body 99, that are, the stage system 10, the first microscope 30, and the second microscope 40 are configured in a similar manner as in the first embodiment.

Figure 9:
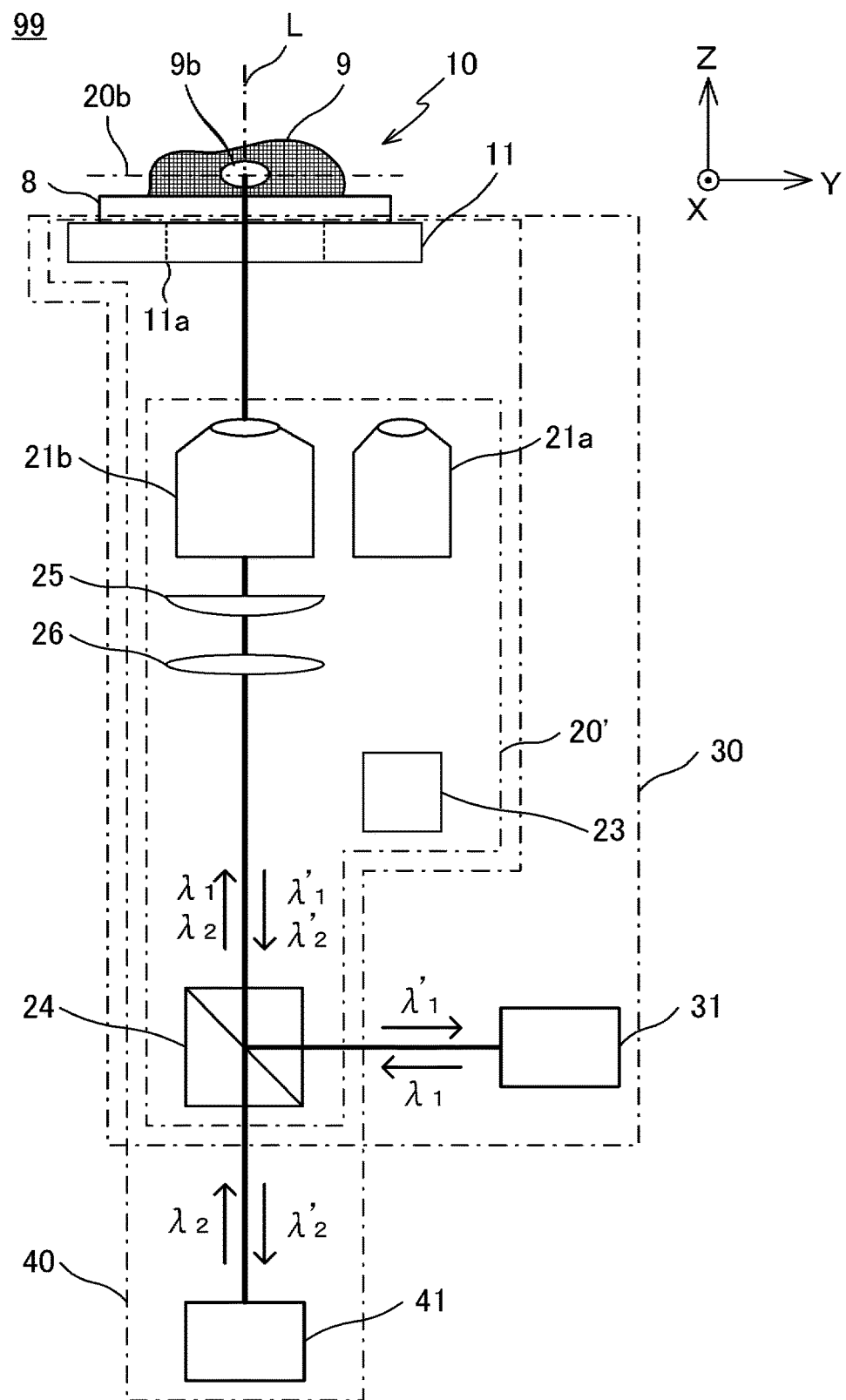
FIG. 9 illustrates a configuration of a body included in a microscope system according to a second embodiment.

FIG. 9 illustrates a configuration of the body 99 included in the microscope system 100 according to the second embodiment, and is particularly illustrating a configuration of the optical system 20'. The optical system 20' includes a plurality of objective lenses 21a and 21b, a cylindrical lens 25, an imaging optical system 26, and a filter 24. Here, the filter 24 is configured in a similar manner as in the first embodiment.

The plurality of objective lenses 21a and 21b are optical elements for focusing intermediate images of the specimen 9 on the stage 11, and, in the second embodiment, the objective lenses 21a and 21b are arranged directly below the stage 11, as an example. The plurality of objective lenses 21a and 21b have a relatively deep and a shallow focal depth, respectively, which are switched to change the focal depths of the first and second microscopes 30 and 40. FIG. 9 illustrates the objective lens 21b in a state disposed on the optical axis L, and a focal plane 20b of the optical system 20' including the objective lens 21b.

The cylindrical lens 25 is a semi-cylindrical lens element for converging light in one direction alone within a plane orthogonal to the optical axis L, and is used in observing a specimen by STORM. The light detected through the cylindrical lens 25 changes the size of the image depending on the distance from the focal plane 20b, and changes the shape of the image depending on the side at which the cylindrical lens 25 is located relative to the focal plane 20b. Accordingly, the three-dimensional coordinates of the positions of the fluorescent dyes that emitted light can be specified on the basis of the size and shape of the detected image.

The imaging optical system 26 is one or more optical elements configured to converge light through the cylindrical lens 25 toward the second illumination/imaging unit 41, and is used in observing the specimen by STORM.

The plurality of objective lenses 21a and 21b are supported by a non-illustrated revolver, where the plurality of objective lenses 21a and 21b are arranged on the optical axis L of the optical system 20 by the rotation of the revolver. Note that the cylindrical lens 25 and the imaging optical system 26 can move back-and-forth on the optical axis L independent of the rotation of the revolver.

Figure 10:
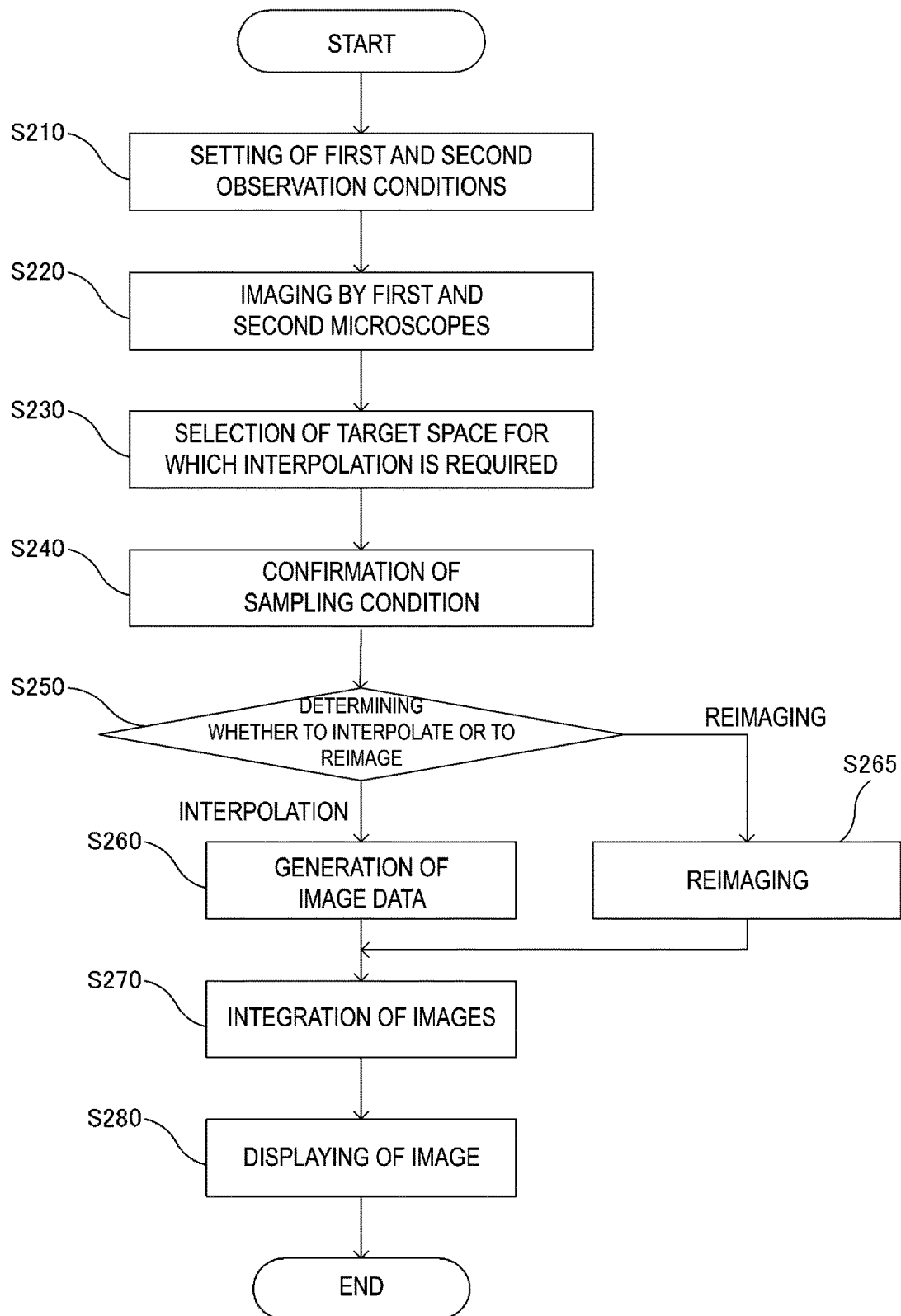
FIG. 10 illustrates a flow of a microscopic observation and an image processing according to the second embodiment.

FIG. 10 illustrates a flow of a microscopic observation and an image processing according to the second embodiment. In this example, a Z-stack image (or a three-dimensional fluorescence image) of the specimen 9 is captured. However, descriptions of the same or corresponding matter as in the flow according to the first embodiment will be omitted as appropriate.

In step 210, the user sets the first and second observation conditions. The first microscopy and the second microscopy among the first and second observation conditions have already been set in the second embodiment, as described above. Moreover, as an example of the imaging conditions of the first observation condition, there are set, using of the objective lens 21a, a range within the XY plane in which imaging is performed, a reference position $Z_1$ on the Z-axis in imaging, a step amount $\Delta Z_1$ in the Z direction, and the number $N_1$ of images to be captured. Further, as an example of the imaging conditions of the second observation condition, which is different from the first observation condition, there are set, using of the objective lens 21b, a range within the XY plane in which imaging is performed, a reference position $Z_2$ on the Z-axis in imaging, a step amount $\Delta Z_2$ in the Z direction, and the number $N_2$ of images to be captured. The user inputs the observation conditions by way of the input unit 51, and the input conditions are sent to the controller 50.

When the user causes the specimen 9 to be supported on the stage 11 and instructs the initiation of the microscopic observation by way of the input unit 51, the process proceeds to the next step 220.

In step 220, an image of the specimen 9 is independently captured by each of the first and second microscopes 30 and 40.

Figure 11:
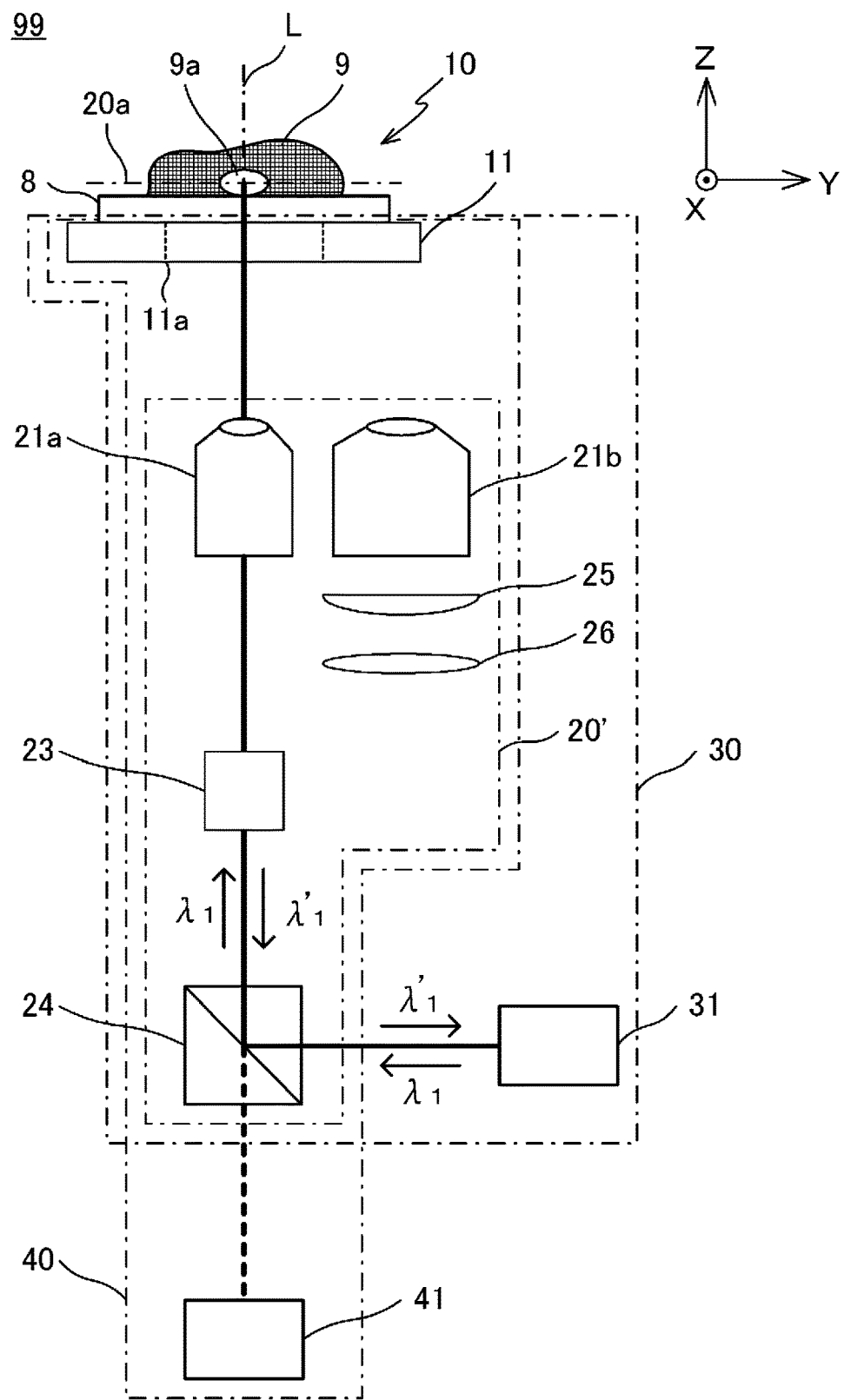
FIG. 11 illustrates an imaging state of a first microscope in a microscope system according to the second embodiment.

FIG. 11 illustrates an imaging state of the first microscope 30. The controller 50 controls an optical system 20' to cause the objective lens 21b, the cylindrical lens 25, and the imaging optical system 26 to be retracted from the optical axis L, and to cause the objective lens 21a to be disposed on the optical axis L. The controller 50 drives the stage system 10 such that the Z position $Z_1$ of the specimen 9 is located at the focal plane 20a of the optical system 20' including the objective lens 21a, and controls the first microscope 30 to capture a cross-sectional image of the specimen 9. The details are the same as in the first embodiment. The imaging results are sent to the image processor 60 and stored on the image generator 61 as microscopic image data of the first microscope 30.

Upon completion of the imaging of the specimen 9 at the Z position $Z_1$, the controller 50 drives the stage 11 in the Z-axis direction to sequentially cause the Z position $Z_1+i\Delta Z_1$ (i=1 to $N_1-1$) to be located at the focal plane 20a, and causes an image of the specimen 9 to be captured. A series of imaging results obtained by the first microscope 30 are sent to the image processor 60, and the imaging results are each stored on the image generator 61 as microscopic image data of the first microscope 30.

Figure 12:
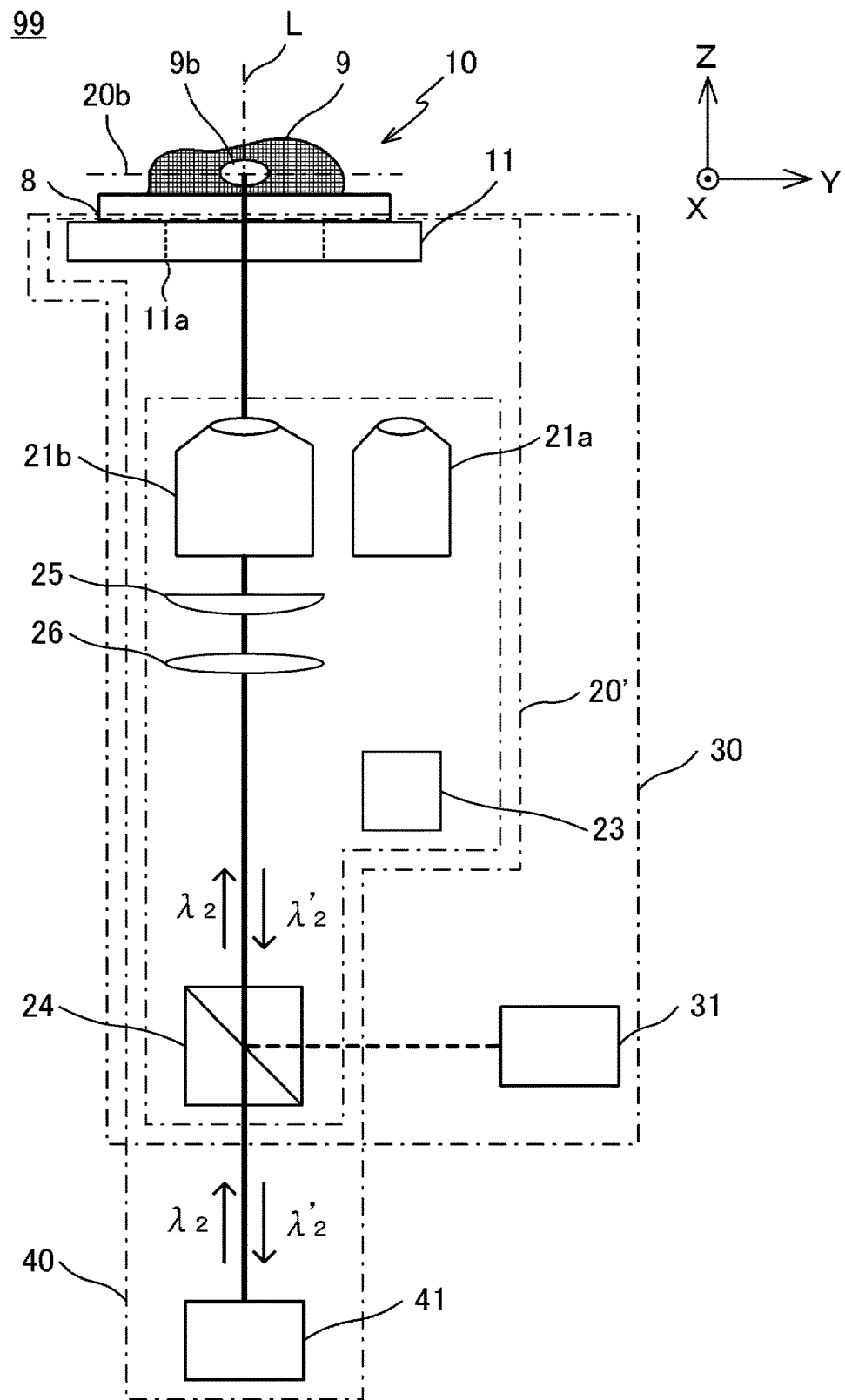
FIG. 12 illustrates an imaging state of a second microscope in a microscope system according to the second embodiment.

FIG. 12 illustrates an imaging state of the second microscope 40. The controller 50 controls the optical system 20' to cause the objective lens 21a and the scanner 23 to be retracted from the optical axis L, and to cause the objective lens 21b, the cylindrical lens 25, and the imaging optical system 26 to be disposed on the optical axis L. The controller 50 drives the stage system 10 to cause the Z position $Z_2$ of the specimen 9 to be located on the focal plane 20b of the optical system 20', and causes an image of the specimen 9 to be captured.

The second microscope 40 causes the second illumination/imaging unit 41 to emit illumination light, to thus illuminate the specimen 9 on the stage 11 through the optical system 20'. Here, the second microscope 40 irradiates fluorescent dyes, which have been caused to be activated at a low concentration, contained in the observation position 9a of the specimen 9 located on the focal point, with excitation light (having a wavelength of $\lambda_2$) to emit fluorescence of the fluorescent dyes (having a wavelength of $\lambda_2'$) alone in an activated state and cause the second illumination/imaging unit 41 to detect the fluorescence through the objective lens 21b, the cylindrical lens 25, and the imaging optical system 26, to thus obtain a fluorescence image.

The second microscope 40 specifies the positions of individual fluorescent dyes. By repetitively performing the above-described activation, excitation, fluorescence image acquisition, and location identification to assign specific luminance values to the positions of the specified plurality of fluorescent dyes, a STORM image is generated.

Upon completion of the imaging of the Z position $Z_2$ of the specimen 9, the controller 50 sequentially causes the Z position $Z_{2j}$ (j=1 to $N_2-1$) of the stage 11 to be located on the focal plane 20b in the Z-axis direction to cause images of the specimen 9 to be captured, and performs formulation of a STORM image at each of the Z positions. The STORM image at each of the Z positions is stored on the image generator 61 as microscopic image data of the second microscope 40.

Figure 13:
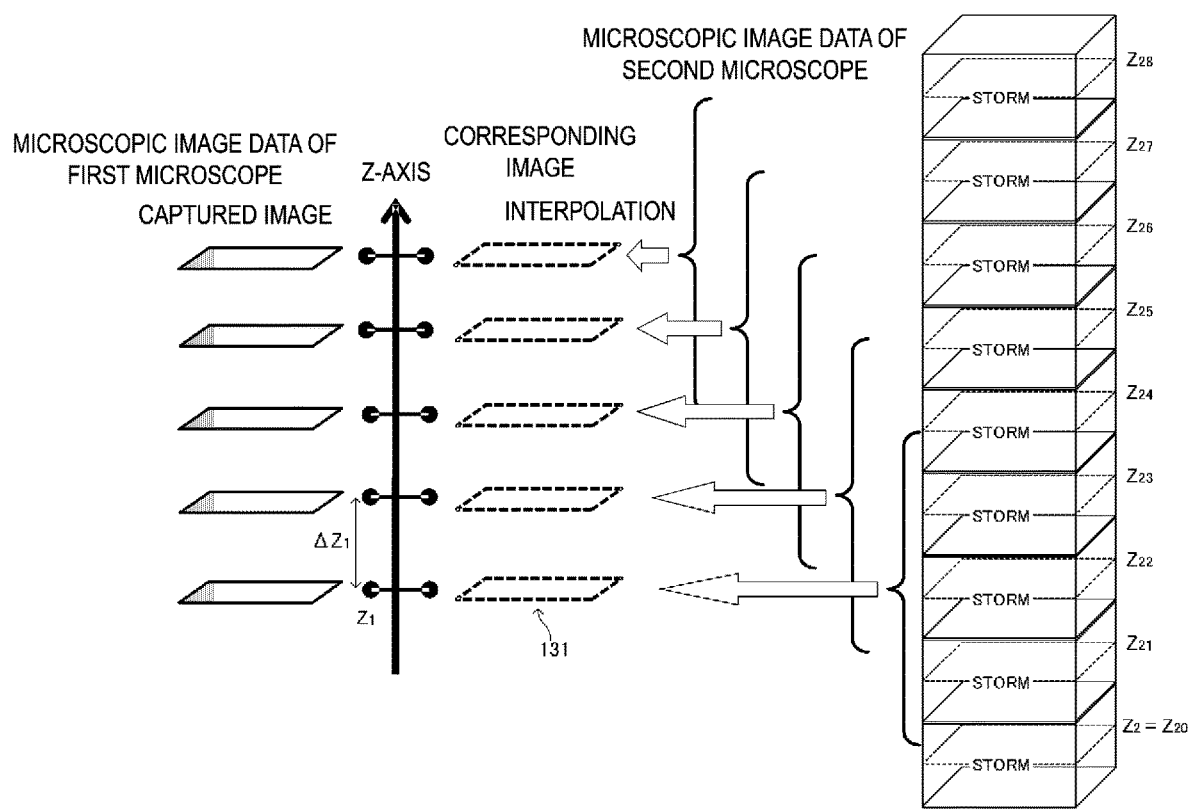
FIG. 13 illustrates an example of correspondences of captured images based on first and second microscopic image data.

FIG. 13 illustrates an example of correspondences of captured images based on microscopic image data obtained by each of the first and second microscopes 30 and 40. The microscopic image data of the second microscope 40, which are data of image in which specific luminance values are assigned to three-dimensional positions, are represented in the drawing as being rectangular parallelepiped bodies to indicate the microscopic image data as being data of three-dimensional image. The number of the rectangular parallelepiped bodies corresponds to the number of steps ($N_2$)

during the imaging. Further, in order to simplify the notation, the $Z_2+j\Delta Z_2$ is represented as $Z_{2j}$ (j=0 to $N_2-1$) (Note: $Z_2=Z_{20}$).

In step 230, as in step 130 in the first embodiment, the user selects the target space being a spatial site to generate corresponding image data by interpolation. The target space can be given by the Z position of the specimen 9. The image processor 60 processes the microscopic image data obtained by each of the first and second microscopes 30 and 40, and causes a list of the captured images contained in each of the microscopic image data to be displayed on the screen of the display 63. The user selects, by way of the input unit 51, a generation of an image at the Z position (illustrated in the drawing using a dotted parallelogram) corresponding to the captured image captured by the first microscope 30, as an image corresponding to the focal depth of the objective lens 21a, from the microscopic image data obtained by the second microscope 40.

In the example of FIG. 13, a plurality of Z positions are selected, thus, the microscopic image data captured at the plurality of Z positions, among the plurality of microscopic image data of the first microscope 30, are each specified as the first microscopic image data.

In step 240, as in step 140 in the first embodiment, the image processor 60 confirms the sampling condition for the target space that has been selected in step 230, and evaluates whether image data for the target space can be generated by interpolation. The details of the sampling condition are the same as in the first embodiment.

In step 250, the user determines, as in step 150 in the first embodiment, whether to generate the image data for the target space by interpolation or by reimaging. When the interpolation is selected, the image processor 60 receives the instruction, and the process proceeds to step 260. When the reimaging is selected, the controller 50 receives the instruction, and the process proceeds to step 265.

In step 260, the image generator 61 generates corresponding image data corresponding to each of the first microscopic image data specified in step 230. Here, the corresponding image data are generated from the second and third microscopic image data so as to correspond to the focal depth of the optical system 20' including the objective lens 21a used in the first microscope 30.

The image generator 61 generates corresponding image data, from the second and third microscopic image data, by superimposing, in the Z-axis direction, points to which specific luminance values are assigned, where the points are within the range of the focal depth of the objective lens 21a, or projects the points on the XY plane. In such a case, different colors may be used in accordance with the Z positions, to thus generate corresponding image data. The second and third microscopic image data to be used for generating the corresponding image data are such data that interpose the Z position of the first microscope image data in between among the plurality of microscopic image data of the second microscope 40. In other words, the corresponding image data are generated on the basis of second and third microscopic image data provided such that the first plane having obtained the first microscope image data is located between the second plane having obtained the second microscopic image data and the third plane having obtained the third microscopic image data.

In step 265, the controller 50 generates microscopic image data for the target space by reimaging. The controller 50 sets the observation conditions for the reimaging, in particular, the objective lens 21a to be used. The controller 50 causes the second microscope 40 to capture an image of the specimen 9 in the same manner as in step 120, except for the use of the objective lens 21a. The details of the above are omitted. The imaging results are sent to the image processor 60 and stored on the image generator 61.

In step 270, as in step 170 in the first embodiment, the image output unit 62 integrates the corresponding image data generated by the image generator 61 in step 260 or the microscopic image data obtained by reimaging in step 265 into the microscopic image data previously obtained in step 220.

In step 280, as in step 180 in the first embodiment, the display 63 display the image integrated in step 270 on the screen. The details are as described above.

Figure 14:
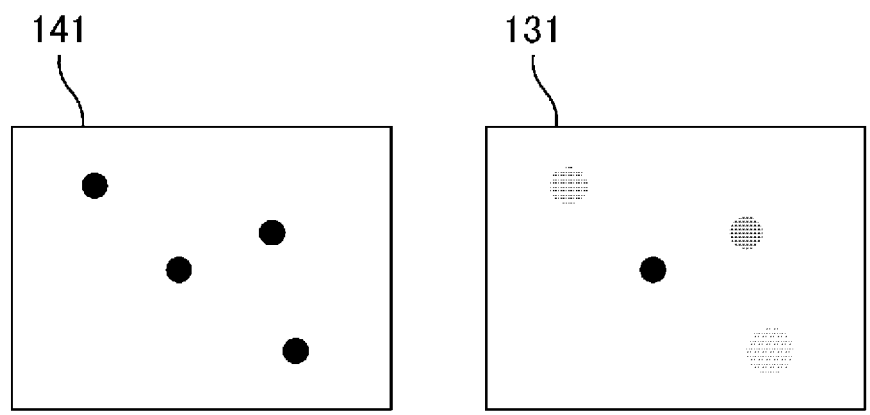
FIG. 14 illustrates an example of an image generated by performing a convolution operation on second microscopic image data.

FIG. 14 illustrates an example of a generated corresponding image. Here, an image 141 is a corresponding image generated by superimposing, in the Z-axis direction, points to which specific luminance values are assigned, where the points are within the range of the focal depth of the objective lens 21a in the second and third microscopic image data. The corresponding image data has been generated by superimposing, in the Z-axis direction, points to which specific luminance values are assigned, within the range of the focal depth of the objective lens 21a, where the Z position being identical to the Z position of the first microscopic image data is the center on the Z-axis, and thus, the Z position corresponds to the Z position of the first microscopic image data. The corresponding image data are an example of image data corresponding to the first microscopic image data in that points to which specific luminance values are assigned are superimposed in the Z-axis direction, where the points are within the range of the focal depth of the objective lens 21a used to obtain the first microscopic image data. Because the second and third microscopic image data are microscopic image data which are obtained, like STORM image data, by the localization method in which the positions of fluorescent dyes are specified and luminance values are assigned to the specified points, the second and third microscopic image data do not involve blurred image, and thus, any Z position, and any range along the Z-axis, where the Z position is the center on the Z-axis, can be cut out. This allows for an easy generation of a corresponding image corresponding to the focal depth of the first microscopic image data using the confocal microscopy, to thus facilitate the comparison.

Note that, in step 260, in place of generating corresponding image data, from the second and third microscopic image data, by superimposing, in the Z-axis direction, points to which specific luminance values are assigned, within the range of the focal depth of the objective lens 21a, the corresponding image data may be generated by performing a convolution operation using a point spread function PSF of the first microscope 30, as described below.

Corresponding image data I can be calculated using second and third microscopic image data O and the point spread function PSF, as described below.

[Equation (5)]

$$I(X, Y, Z) = \sum_{X',Y',Z'} PSF(X, Y, Z, X', Y', Z')O(X', Y', Z') \quad (5)$$

However, the second and third microscopic image data O, as recognizable from FIG. 13, have been obtained as distribution of points to which specific luminance values are assigned in a predetermined three-dimensional space (X, Y, Z). Note that the second and third microscopic image data O, which are a set of luminance values related to discrete X, Y, Z coordinates, are herein represented as functions related to coordinates X, Y, Z, for the sake of convenience.

Here, assuming that the point spread function PSF can be approximated by a function being independent of position, Equation (5) may be rewritten as below.

[Equation (6)]

$$I(X, Y, Z) = \sum_{X',Y',Z'} PSF(X - X', Y - Y', Z - Z')O(X', Y', Z') \quad (6)$$

However, the PSF of the first microscope 30 is used as the point spread function PSF, and the second and third microscopic image data O are subjected to convolution operation over a depth range corresponding to the focal depth of the objective lens 21a. The PSF of the first microscope 30 may include, for example, PSF of the optical system 20, PSF of an illumination optical system representing an illumination pattern, PSF of pinhole, a product of these, and the like.

The right side of Equation (6) can be calculated using a discrete Fourier transform. The image generator 61 performs discrete Fourier transform on each of the second and third microscopic image data O and the point spread function PSF, and calculates the right side by performing inverse discrete Fourier transform on the product of the Fourier transforms of the second and third microscopic image data O and the point spread function PSF.

An image 131 in FIG. 14 indicates an example of an image obtained using a point spread function PSF that represents the spread of an image of a bright point by the objective lens 21a in Equation (6). In the image 131, by performing a convolution operation on the second microscopic image data by Equation (6) using the point spread function PSF, a component of the blur contained in the first microscopic image data is imported, and thus, the S/N ratio (signal to noise ratio) of the image becomes close to the first microscopic image data. The S/N ratios of the image quality of the image data, which are close to each other, enable an easy comparison between the mutual image data.

Note that, in the second embodiment, target image data are generated, but not limited to, using the second and third microscopic image data. In addition to the second and third microscopic image data, other microscopic image data may also be used, in accordance with the focal depth of target image data I, among the plurality of microscopic image data of the second microscope 40.

Although under the microscopic observation of the microscope system 100 according to the second embodiment, different objective lenses 21a and 21b are used for the first and second microscopes 30 and 40, respectively, in capturing the image of the specimen in step 220, however, without being limited to this, a common objective lens may also be used. The objective lens 21b may be used for the first microscope 30, and the objective lens 21a may be used for the second microscope 40.

Note that, under the microscopic observation using the microscope system 100 according to the second embodiment, a corresponding image corresponding to the focal depth of the objective lens 21a used in the first microscope 30 is generated from the second and third microscopic image data obtained by the second microscope 40 in step 260, however, in contrast to this, a corresponding image corresponding to the focal depth of the objective lens 21b used by the second microscope 40 may be generated from the first microscopic image data obtained by the first microscope 30.

In such a case, in step 230, the user selects the target space to generate corresponding image data. The target space can be given by the Z position of the specimen 9. The image processor 60 processes the microscopic image data obtained by each of the first and second microscopes 30 and 40, and causes a list of the captured images contained in each of the microscopic image data to be displayed on the screen of the display 63. On the basis of the display on the screen, the user, by way of the input unit 51, selects a Z position of any of the microscopic image data of the second microscope 40 as the target space, from the microscopic image data obtained by the first microscope 30, and selects a generation of a corresponding image corresponding to the focal depth of the objective lens 21b used by the second microscope 40. This allows the first microscopic image data to be specified from the microscopic image data of the first microscope 30, and allows the second and third microscopic image data to be specified from the microscopic image data of the second microscope 40.

In such a case, in step 260, the image generator 61 generates the corresponding image data by performing, for example, an inverse convolution operation on the first microscopic image data, so that the corresponding image data may correspond to the focal depth of the objective lens 21b used by the second microscope 40. The degree of the blur is reduced in the corresponding image data by the inverse convolution operation. As such, generating a corresponding image corresponding to the focal depth of the objective lens 21b used by the second microscope 40 from the first microscopic image data enables an easy comparison between the mutual image data.

Moreover, the image output unit 62, in step 270, may superimpose, with respect to the Z-axis direction, points of specific luminance values included within the range of the focal depth of each of the Z positions of the target space from the second and third microscopic image data, to create a pair image for the corresponding image data, and may display the pair image on the screen of the display 63, in step 280.

Note that, the microscope system 100 according to the second embodiment shares the stage 11 and a part of the optical system 20 between the first and second microscopes 30 and 40, however, alternatively, each of the first and second microscopes 30 and 40 may have an individual stage and an optical system as dedicated components. In such a case, a marker may be provided, in proximity to the specimen, on the holding member 8 for holding a specimen, where images of the specimen can be captured for a range equal to each other by determining the position of the specimen relative to the marker in observing the specimen with each of the microscopes.

Note that, under the microscopic observation using the microscope system 100 according to the second embodiment, the user can select, in step 250, the reimaging in a case where the specimen 9 is reusable, such as in a case where the specimen 9 is a fixed specimen, for example. Here, when the user selects, in step 250, the reimaging despite the unavailability of the reuse of the specimen 9, the reimaging may not be performed in step 265, and the process proceeds to the next step 270. Additionally, in step 250, the display 63 may display the unavailability of the reuse of the specimen 9 to indicate the user to select the interpolation.

A third embodiment of the present disclosure will now be described.

Under the microscopic observation of the microscope system 100 in the first and second embodiments, an image of the specimen is captured using a common objective lens or different objective lenses by the first and second microscopes 30 and 40. In such a case, the obtained microscopic image data have incorporated the image of the specimen within the range of the focal depth of the objective lens that is used, making it possible to extract the image of the specimen at any depth within the range of the focal depth from the microscopic image data. In contrast, in the microscopy without using of an objective lens, for example, an electron microscopy in which the surface of a specimen is observed while irradiating the specimen with an electron beam, the specimen is sliced and an image of the surface structure of the sliced specimen is captured, where the image of the unsliced portion is not captured in the microscopic image data, and thus, the image cannot even be extracted from the microscopic image data. In the third embodiment, in such a case, image data, including the image of the unsliced portion, are generated from the microscopic image data obtained for the portion of the sliced specimen.

In the third embodiment, the microscope system 100 according to the first embodiment is used, where, as an example, a STORM is employed as a first observation condition (first microscopy) for the first microscope 30, and an electron microscopy is employed as a second observation condition (second microscopy) for the second microscope 40.

The second microscope 40 includes, for example, an electron gun, a focusing lens and an objective lens, a scanning coil, and a detector (all of them are not illustrated). Here, the specimen to be observed is sliced to an appropriate thickness and is supported as a sample on the stage 11. The second microscope 40 causes an electron gun to accelerate an electron beam by acceleration voltage of, for example, several 100 V to several 10 kV, causes focusing lenses and objective lenses to focus the electron beam into a one spot, causes a scanning coil to move the spot on the sample to perform electron beam scanning on the sample, and causes a detector to detect signal electrons emitted from the sample. The detection results are sent to the image processor 60 (the image generator 61) as second and third microscopic image data, thus generating image data in which the amount of signal electrons is the brightness of each of the points. Note that the generated amount of signal electrons varies depending on the surface structure of the specimen, where the image data represent the surface structure of the specimen.

The first microscope 30 is configured independently of the second microscope 40 in the microscope system 100. The configuration of the first microscope 30 is the same as in the second embodiment.

Figure 15:
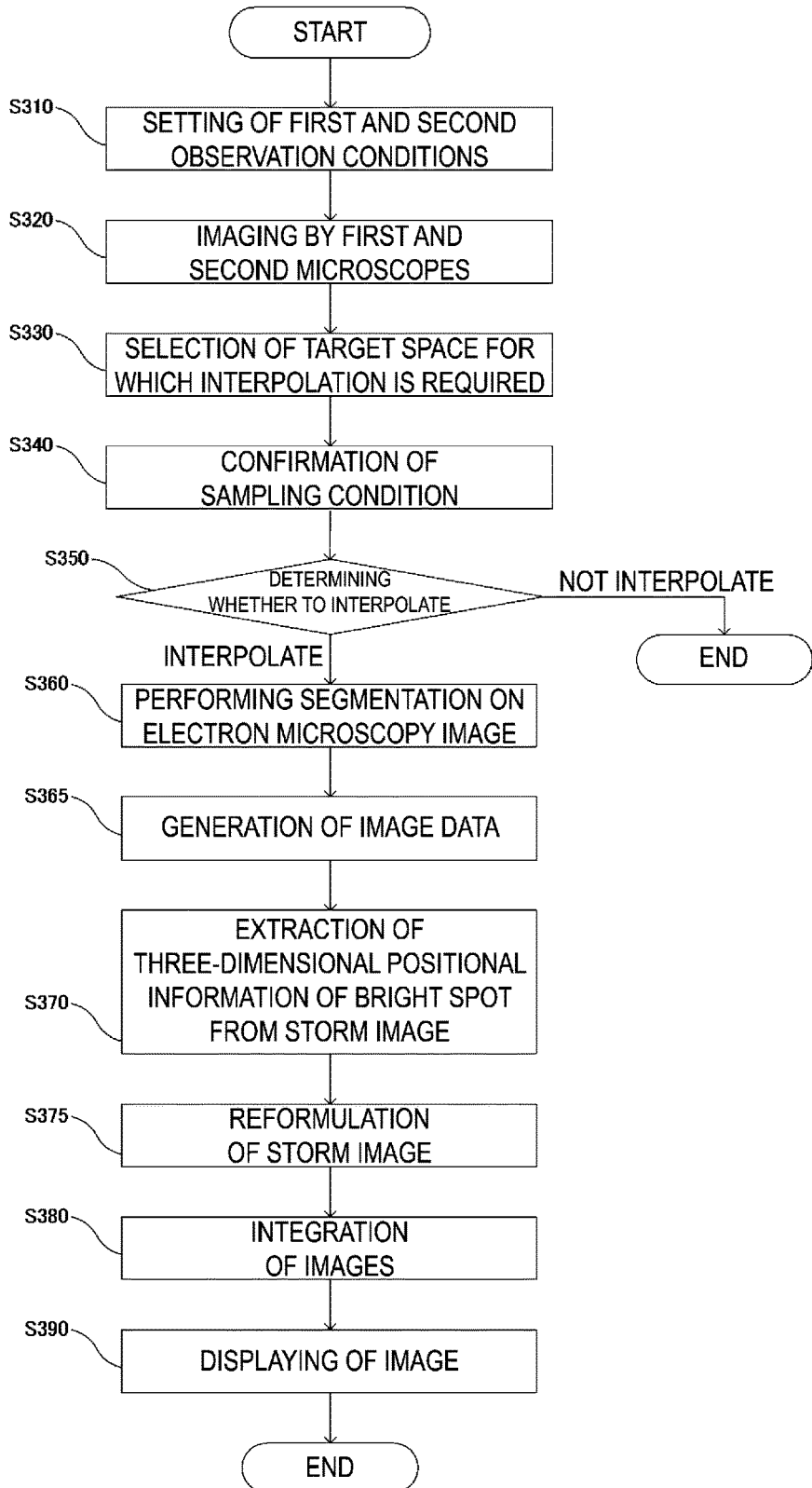
FIG. 15 illustrates a flow of a microscopic observation and an image processing according to a third embodiment.

FIG. 15 illustrates a flow of a microscopic observation and an image processing according to the third embodiment. However, descriptions of the same or corresponding matter as in the flows according to the first and second embodiments will be omitted as appropriate.

In step 310, the user sets the first and second observation conditions as in steps 110 and 210 in the first and second embodiments. In the third embodiment, the first microscopy and the second microscopy among the first and second observation conditions have already been set, as described above. Moreover, as an example of the imaging conditions of the first observation condition, a reference position $Z_1$ on the Z-axis in imaging, a step amount $\Delta Z_1$ in the Z direction, and the number $N_1$ of images to be captured are set. As an example of the imaging conditions of the second observation condition, there are set, a range within the XY plane in which imaging of the specimen 9 is performed, and the number $N_2$ of images to be captured (which is equal to the number of the samples). Further, as the information about the specimen, the thickness of each of the samples, and the Z position of the specimen 9 of each of the samples are included, for example. The user inputs these observation conditions by way of the input unit 51, and the input conditions are sent to the controller 50.

In step 320, images of specimens are independently captured by each of the first and second microscopes 30 and 40.

First, an image of the specimen is captured by the first microscope 30. The details are the same as in the second embodiment.

An imaging is performed by the first microscope 30, followed by an imaging of the specimen by the second microscope 40. The user causes the specimen used for the imaging by the first microscope 30 to be sliced into a plurality of pieces in the depth direction in accordance with the imaging conditions, and causes one of the pieces, as a sample, to be supported on the stage 11. The controller 50 controls the stage system 10 to drive the stage 11 in the Z-axis direction to locate the surface of the sample on the spot of the electron beam. In this state, the controller 50 causes the second microscope 40 to perform electron beam scanning on the sample. This allows an image of the surface structure of the sample coming for the first time to be captured.

The controller 50, upon completion of imaging for the sample coming for the first time, causes the electron gun to stop and then causes the stage 11 to be retracted from the spot. The user causes the sample coming for the second time to be supported on the stage 11. The controller 50 performs electron beam scanning on the sample coming for the second time in the same manner as previously performed. Similarly, the controller 50 sequentially performs electron beam scanning on all the samples. A series of imaging results obtained by the second microscope 40 are sent to the image processor 60, and are stored on the image generator 61 as a plurality of microscopic image data of the second microscope 40.

Figure 16:
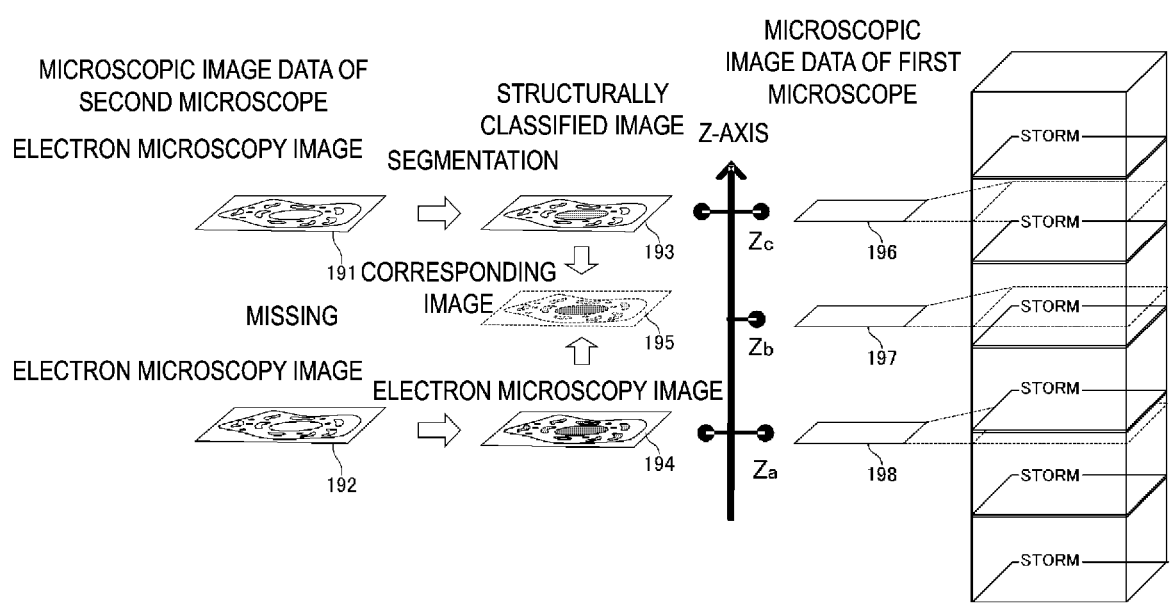
FIG. 16 illustrates an example of correspondences between captured images based on first and second microscopic image data.

FIG. 16 illustrates an example of correspondences between captured images based on microscopic image data obtained by each of the first and second microscopes 30 and 40. The microscopic image data (electron microscopy image) of the second microscope 40 represent the surface structure of a sample sliced at mutually different Z positions Za and Zc within the specimen. The microscopic image data (STORM image) of the first microscope 30 is as described in the second embodiment.

In step 330, as in steps 130 and 230 in the first and second embodiments, the user selects the target space being a spatial site to generate corresponding image data by interpolation. The target space can be given by the Z position of the specimen 9. The image processor 60 processes the microscopic image data obtained by each of the first and second microscopes 30 and 40, and causes a list of the captured images based on each of the microscopic image data, and images 191 and 192 and images 196 and 198 with respect to the Z positions Za and Zc to be displayed on the screen of the display 63. The user recognizes, from the display on the screen, that the imaging has been performed by the first microscope 30, but the imaging has not been performed at the Z position Zb by the second microscope 40. The user selects, by way of the input unit 51, a generation of corresponding image data at the Z position Zb of the specimen 9 from the microscopic image data obtained by the second microscope 40.

This allows the microscopic image data of the Z position Zb among the plurality of microscopic image data of the first microscope 30 to be specified as the first microscopic image data. Moreover, the second microscopic image data captured at the Z position Za and the third microscopic image data captured at the Z position Zc, where the Z position Za and the Z position Zc interpose the Z position Zb, are specified among the plurality of microscopic image data of the second microscope 40. Moreover, a corresponding image at the Z position Zb being the same as the first microscopic image data is generated from the second microscopic image data and the third microscopic image data, as described below.

In step 340, as in steps 140 and 240 in the first and second embodiments, the image processor 60 confirms the sampling condition.

In step 350, as in steps 150 and 250 in the first and second embodiments, the user determines whether to generate image data for the target space by interpolation. When the interpolation is selected, the image processor 60 receives the instruction, and the process proceeds to step 360. When the non-interpolation is selected, the controller 50 receives the instruction, and terminates the flow.

In steps 360 and 365, the image generator 61 generates, by interpolation, corresponding image data for the target space. Herein, the corresponding image data 195 corresponding to depth Zb within the specimen is generated on the basis of the respective patterns of the captured images 191 and 192 at the positions Za and Zc, which are the second and third microscopic image data obtained by electron microscopy.

In step 360, a segmentation method is performed to structurally classify the patterns in the captured images 191 and 192. The image generator 61 extracts the captured images 191 and 192 at depths Za and Zc within the specimen from the first microscopic image data, and causes the captured images to be displayed on the screen of the display 63. The image generator 61 or the user performs a segmentation on the respective captured images 191 and 192. More specifically, in the captured images 191 and 192 of the sample obtained by electron microscopiestructural bodies within the image are each distinguished, and the areas containing the distinguished structural bodies are each colored using different colors. Thereby, as illustrated in FIG. 16, two images 193 and 194 that have been structurally classified are obtained.

In step 365, the image data 195 is generated from the two images 193 and 194 that have been structurally classified. The image generator 61 performs a comparison of the structural bodies distinguished between the two images 193 and 194, and generates areas of the structural bodies in a corresponding image data 195 by interpolating the shape of the areas of the corresponding structural bodies in accordance with the depths Za, Zb, and Zc. The interpolation can be performed such that, for example, interpolated points of the same number are arranged at equal intervals, between the two images 193 and 194, on the outer edges of the areas of the corresponding structural bodies, the positions of the interpolation points in the corresponding image data 195 are each obtained by weight averaging the positions of the two corresponding points in the XY plane, that are, for example, most approximate to each other, using the depths Za, Zb, and Zc, and then the plurality of interpolation points thus obtained are continuously connected to one another. At this time, the image generator 61 can determine whether the structural bodies correspond to each other on the basis of, for example, the analogy of the shapes of the areas of the structural bodies, and the degree of superimposition between the two images 193 and 194, and can comprehend a continuous deformation in the depth direction of the structural bodies. The images 191 and 192 obtained by electron microscopy is typically a binary representation such as monochrome, making it difficult to distinguish the structural bodies on the image, and making it difficult to comprehend the structural changes in the depth direction of the specimen. Therefore, the structural bodies are distinguished by segmentation method to thus distinguish the structural bodies on the images 191 and 192, and thus, the corresponding image data 195 can be generated more accurately by utilizing the continuous changes in the depth direction of the identical structural body.

In step 370, the image generator 61 extracts, from the first microscopic image data (STORM image data), three-dimensional positional information of a specific luminance value at each of the Z positions Za and Zc of the specimen 9, of which images captured by the first microscope 30 in step 320, and the Z position Zb of the specimen 9, which has been selected in step 330.

In step 375, the image generator 61 reformulates STORM images 196 to 198 respective of the Z positions Za, Zb, and Zc using the three-dimensional positional information of the specified luminance value having been extracted in step 370. The STORM images 196 to 198 are reformulated, for example, by superimposing, in the Z direction, points having specific luminance values by the thickness of the sample.

In step 380, as in steps 170 and 270 in the first and second embodiments, the image output unit 62 integrates the corresponding image data 195 generated by the image generator 61 in step 365 into the second and third microscopic image data to compile the integrated data into a series of image data, and integrates the STORM images 196 to 198 reformulated in step 375 into a series of image data.

In step 390, as in steps 180 and 280 in the first and second embodiments, the display 63 displays the image compiled or integrated in step 380 on the screen. The details are as described above.

Note that, under the microscopic observation using the microscope system 100 according to the third embodiment, the Z position Zb of the specimen 9 is selected as the target space in step 330, and corresponding image data are generated, in steps 360 and 365, on the basis of a pattern of electron microscopy image obtained at each of the Z positions Za and Zc that is likely to interpose the Z position Zb in between. Alternatively, at least two different electron microscopy images may be used to be extrapolated into the positions (Zb<Za or Zb>Zc) outside of the depth (Za, Zc) within the specimen from which the respective images are obtained, to thus generate corresponding image data corresponding to the target space.

Note that, under the microscopic observation using the microscope system 100 according to the third embodiment, image data of electron microscopy image are generated from the second and third microscopic image data in steps 360 and 365 prior to the reformulation of the STORM image from the first microscopic image data in steps 370 and 375, however, in contrast to this, the STORM image may be reformulated from the first microscopic image data prior to the generation of the image data of electron microscopy image from the second and third microscopic image data.

Note that under the microscopic observation of the microscope system 100 according to the third embodiment, the STORM image is reformulated by superimposing, in the Z direction, points having specific luminance values of the first microscopic image data in step 370, however, alternatively, the STORM image may be reformulated by performing a convolution operation using a point spread function PSF as described in the second embodiment.

Note that, under the microscopic observation using the microscope system 100 according to the third embodiment, the image data are generated by interpolation, by performing a segmentation method to structurally classify the images captured by electron microscopy using the second microscope 40, however, without being limited to this, image data may be generated by weighted average of two images (i.e., luminance values) as described previously with reference to FIG. 8.

Note that, under the microscopic observation of the microscope system 100 according to the third embodiment, the specimen 9 is sliced after the capturing images of the specimen 9 by the first microscope 30, and an image of each of the slices is to be captured as a sample by the second microscope 40, however, alternatively, a specimen may be sliced prior to the imaging by the first and second microscopes 30 and 40, and an image of each of the slices may be captured as a sample by both the first and second microscopes 30 and 40. In such a case, the order of capturing images of the sample by the first and second microscopes 30 and 40 may be freely determined.

A fourth embodiment of the present disclosure will now be described.

In the fourth embodiment, when images of an identical specimen is sequentially captured by a plurality of microscopes to each formulate a time series image (also referred to as a time-lapse image), by generating, from one chronological images, images corresponding to times at which images included in the other chronological images, the time series images are made comparable to each other.

In the fourth embodiment, the microscope system 100 according to the first embodiment is used, where, as an example, a confocal microscopy is employed as a microscopy for the first microscope 30, and structured illumination microscopy (SIM) is employed as a microscopy for the second microscope 40. Further, an identical type of fluorescent dye is to be introduced into the specimen 9 in the first and second microscopies, and in correspondence to this, mutually equal wavelengths are employed in the illumination conditions.

Figure 17:
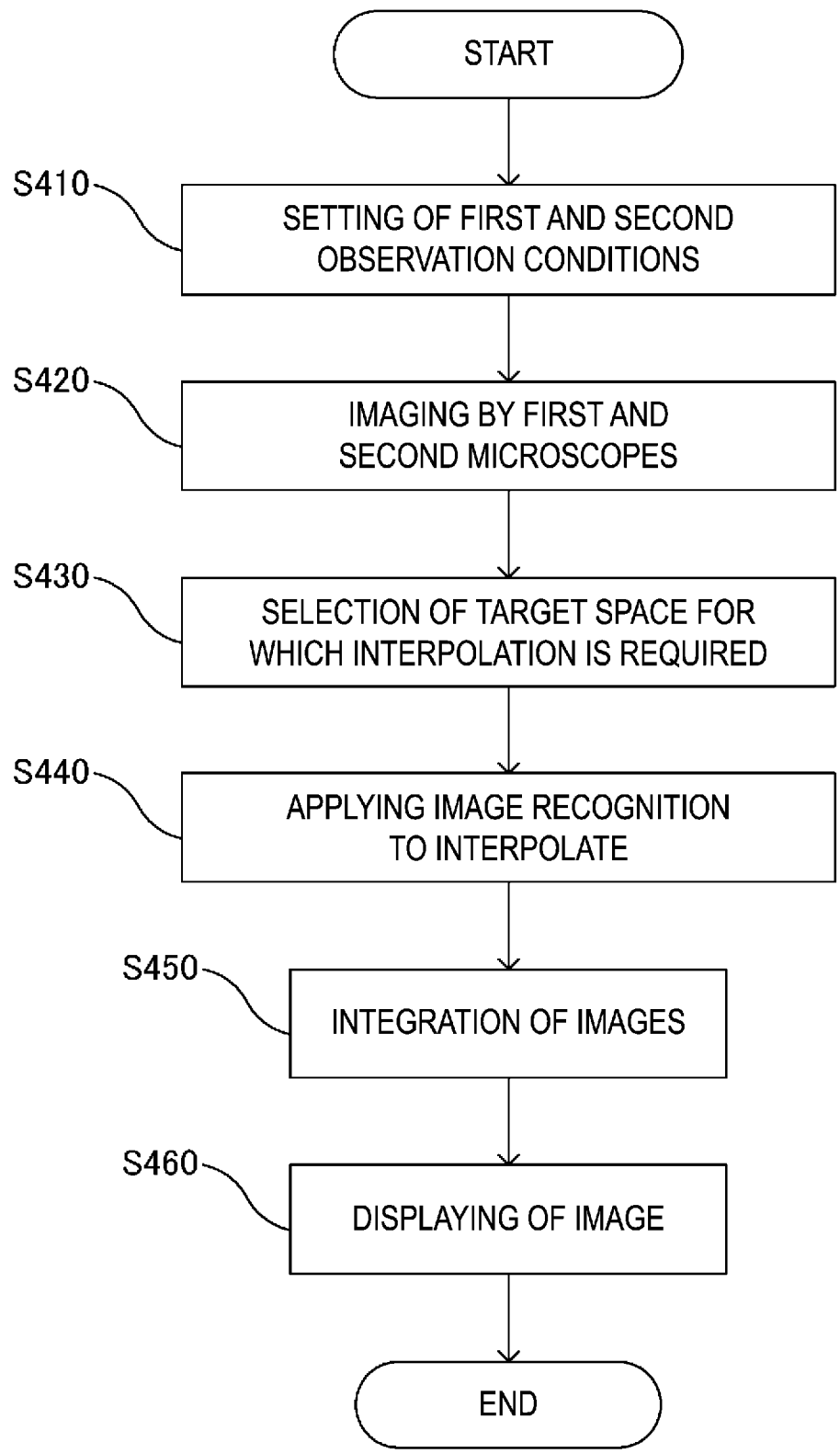
FIG. 17 illustrates a flow of a microscopic observation and an image processing according to a fourth embodiment.

FIG. 17 illustrates a flow of a microscopic observation and an image processing according to the fourth embodiment. In this example, a time series image of the specimen 9 is captured. However, descriptions of the same or corresponding matter as in the flows according to the first to third embodiments will be omitted as appropriate.

In step 410, the user sets the first and second observation conditions. The first microscopy and the second microscopy among the first and second observation conditions have already been set in the fourth embodiment, as described above. Further, as an example of the imaging conditions of the first observation condition, there are set, using of the objective lens 21a, a range within the XY plane in which imaging is performed, an imaging start time $T_1$, an imaging interval $\Delta T_1$, and the number $N_1$ of images to be captured. Further, as an example of the imaging conditions of the second observation condition, there are set, using of the objective lens 21b, a range within the XY plane in which imaging is performed, an imaging start time $T_2$, an imaging interval $\Delta T_2$, and the number $N_2$ of images to be captured. Moreover, in the following descriptions, the imaging conditions are to be set such that $T_1 < T_2$, $\Delta T_1 = \Delta T_2$, and $N_1 = N_2$ (i.e., alternate imaging by the first and second microscopes 30 and 40), as an example. This allows the first and second microscopes 30 and 40 to alternate imaging of the specimen 9. The user inputs these observation conditions by way of the input unit 51, and the input conditions are sent to the controller 50.

When the user causes the specimen 9 to be supported on the stage 11 and instructs the initiation of the microscopic observation by way of the input unit 51, the process proceeds to the next step 420.

In step 420, images of the specimen 9 are alternately captured by the first and second microscopes 30 and 40. Prior to the imaging, the controller 50 causes the stage 11 to be driven in the Z-axis direction to locate the Z position of the specimen 9 on the focal plane 20a.

The controller 50 causes the first microscope 30 to capture an image of the specimen 9 at the time $T_1$. Prior to the imaging, the controller 50 controls the optical system 20 to switch to the objective lens 21a.

Figure 18:
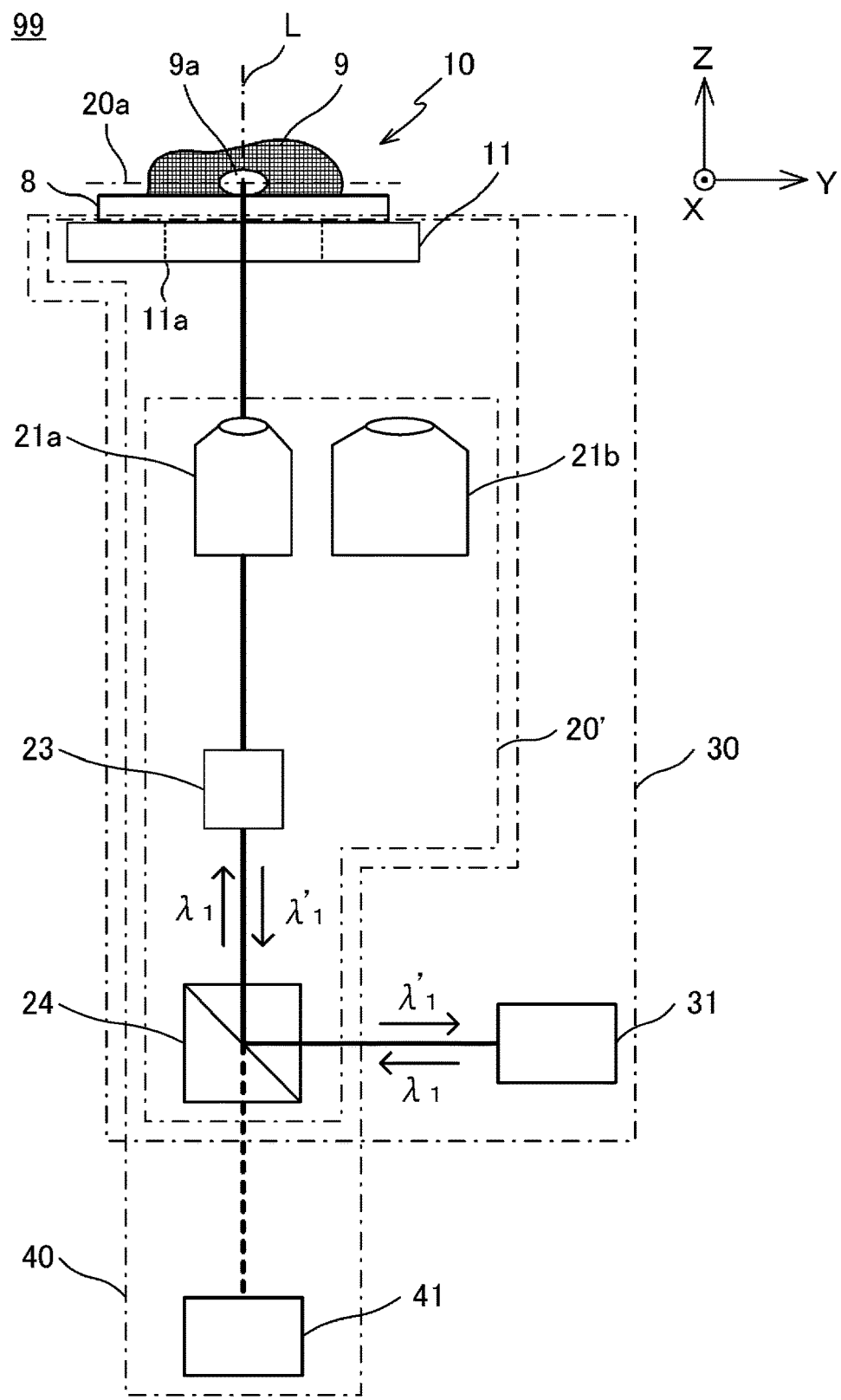
FIG. 18 illustrates an imaging state of a first microscope in a time-lapse imaging.

As illustrated in FIG. 18, the first microscope 30 causes the first illumination/imaging unit 31 to emit illumination light having a wavelength of Xi, and causes the specimen 9 on the stage 11 to be illuminated through the optical system 20 (the objective lens 21a). This allows the observation position 9a of the specimen 9 located on the focal point to be illuminated, to thus cause the fluorescent dye contained in the specimen 9 to emit fluorescence with a wavelength of $\lambda_1'$. The fluorescence is converged through the optical system 20 (the objective lens 21a), and is captured by the first illumination/imaging unit 31. In parallel with the capturing of the fluorescence, the controller 50 controls the scanner 23 to cause the illumination light to swing in the XY direction, to thus perform scanning of the specimen 9 within the XY scanning range on the focal plane 20a. Thereby, the specimen 9 is scanned, and a cross-sectional image of the specimen 9 at the Z-scan position is captured.

While an image of the specimen 9 is captured by the first microscope 30, the second microscope 40 is stopped.

After the termination of imaging by the first microscope 30, the controller 50 causes the second microscope 40 to capture an image of the specimen 9 at the time $T_2$. Prior to the above, the controller 50 controls the optical system 20 to switch to the objective lens 21b.

Figure 19:
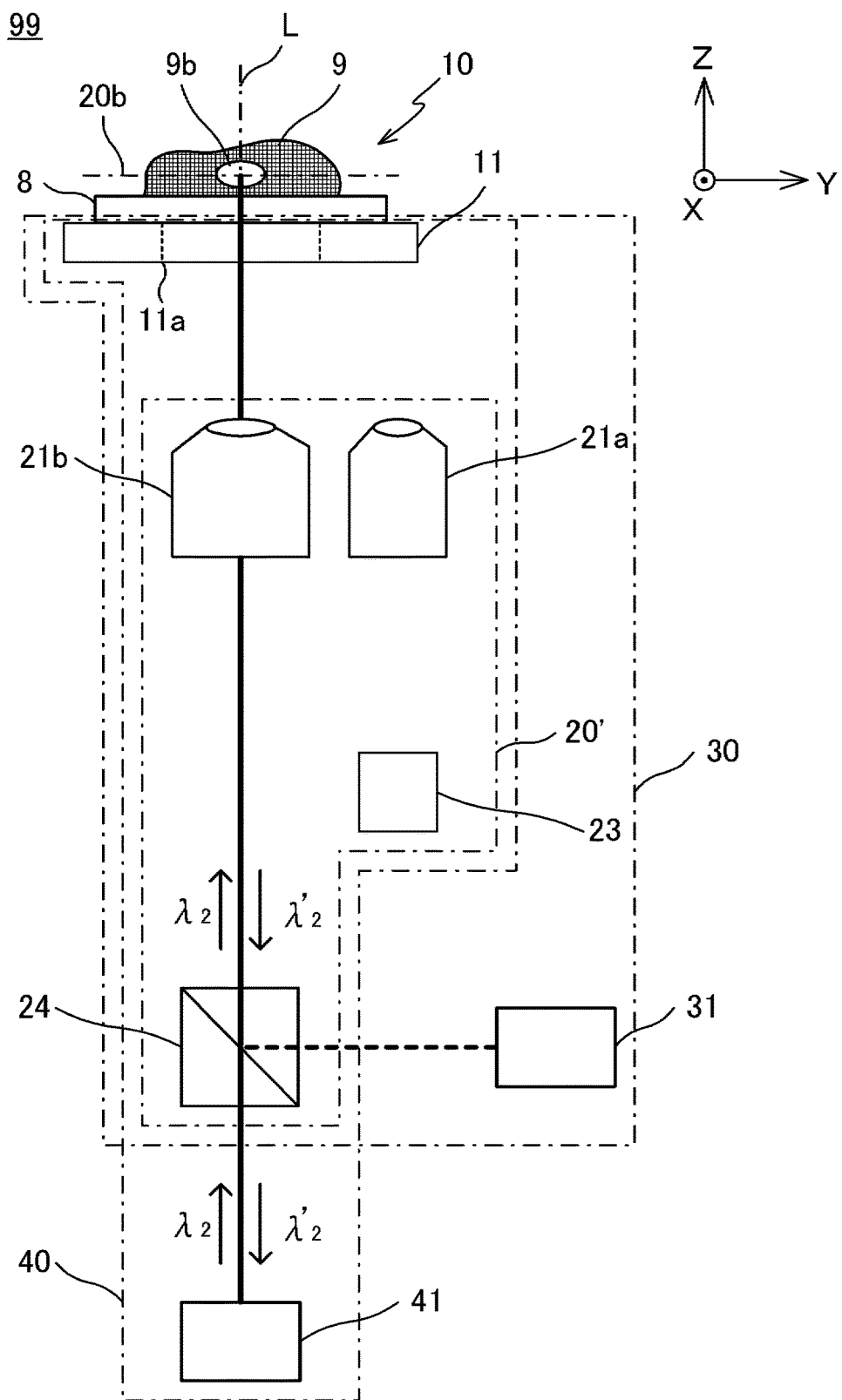
FIG. 19 illustrates an imaging state of a second microscope in a time-lapse imaging.

As illustrated in FIG. 19, the second microscope 40 causes the second illumination/imaging unit 41 to emit illumination light having a wavelength of $\lambda_2$, and causes the specimen 9 on the stage 11 to be illuminated through the optical system 20 (the objective lens 21b). This allows the observation position 9b of the specimen 9 located on the focal point to be illuminated, to thus cause the fluorescent dye contained in the specimen 9 to emit fluorescence with a wavelength of $\lambda_2'$. The fluorescence is converged through the optical system 20 (the objective lens 21b), and is captured by the second illumination/imaging unit 41. Note that while the second microscope 40 performs imaging, the scanner 23 is retracted from the optical axis L.

The first microscope 30 is stopped while the second microscope 40 performs imaging of the specimen 9.

After the termination of imaging by the second microscope 40, the controller 50 causes the optical system 20 to switch to the objective lens 21a, causes the first microscope 30 to capture an image of the specimen 9 at the time $T_1 + \Delta T_1$, controls the optical system 20 to switch to the objective lens 21b, and causes the second microscope 40 to capture an image of the specimen 9 at the time $T_2 + \Delta T_2$. The controller 50 causes the first and second microscopes 30 and 40 to repeatedly alternate imaging of the specimen 9. This allows images of the specimen 9 to be successively captured with respect to time. A series of imaging results obtained by the first microscope 30 are sent to the image processor 60, and are stored on the image generator 61 as a plurality of microscopic image data of the first microscope 30. A series of imaging results obtained by the second microscope 40 are sent to the image processor 60, and are stored on the image generator 61 as a plurality of microscopic image data of the second microscope.

Figure 20:
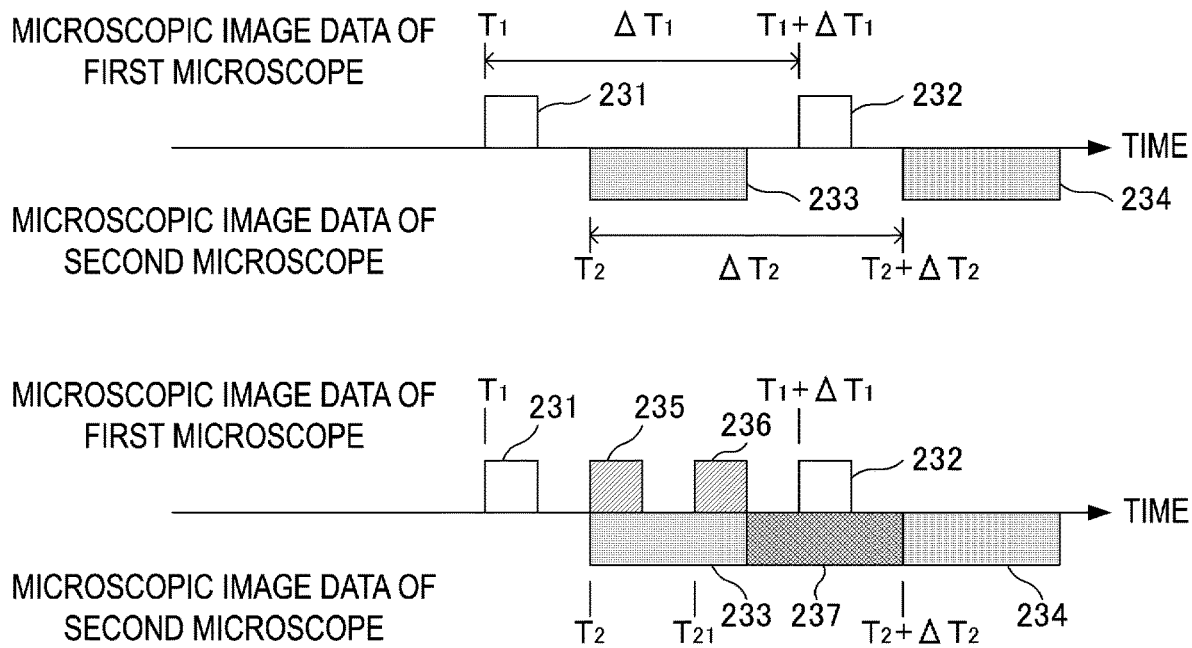
FIG. 20 illustrates an example of a timing chart in which imaging of a specimen is performed by first and second microscopes.

FIG. 20, upper row, illustrates an example of a timing chart in which an image of the specimen 9 is captured by the first and second microscopes 30 and 40. The microscopic image data of the first and second microscopes 30 and 40 each include image data obtained at mutually different times under the first and second observation conditions. Under the above-described imaging conditions, capturing images of the specimen 9 at different times $T_1+n\Delta T_1 \neq T_2+n\Delta T_2$ (n=0 to $N_1-1$), where $T_1<T_2$, $\Delta T_1=\Delta T_2$, and $N_1=N_2$, that is, alternately capturing images of the specimen 9, by the first and second microscopes 30 and 40, allows images of the specimen 9 to be captured at different magnification ratios using different objective lenses 21a and 21b, and allows the specimen 9 to be illuminated using illumination light of the same wavelengths, however, an image of the specimen 9 may not be captured by one microscope at the time when the image of the specimen 9 is captured by the other microscope, and thus, no microscope images corresponding in time to each other are present.

In step 430, the user selects a target time to generate corresponding image data by interpolation. The image processor 60 processes the microscopic image data obtained by each of the first and second microscopes 30 and 40, and causes a list of the captured images contained in each of the two microscopic image data to be displayed on the screen of the display 63. The user recognizes, from the display, that no image corresponding to the image captured at (between) the time $T_2$ (and time $T_1+\Delta T_1$) by the second microscope 40 has been captured among the microscopic image data of the first microscope 30, and no image corresponding to the image captured at the time $T_1+\Delta T_1$ by the first microscope 30 has been captured among the microscopic image data of the second microscope 40. The user selects, by way of the input unit 51, the target time, for example, by clicking or touching, or the like a point on the screen indicating the time. Herein, it is assumed that, as the target times, the times $T_2$ and $T_{21}$ are selected for the microscopic image data of the first microscope 30 and the time $T_1+\Delta T_1$ is selected for the microscopic image data of the second microscope 40.

In step 440, the image generator 61 generates, by interpolation, corresponding image data for the target time.

Figure 21:
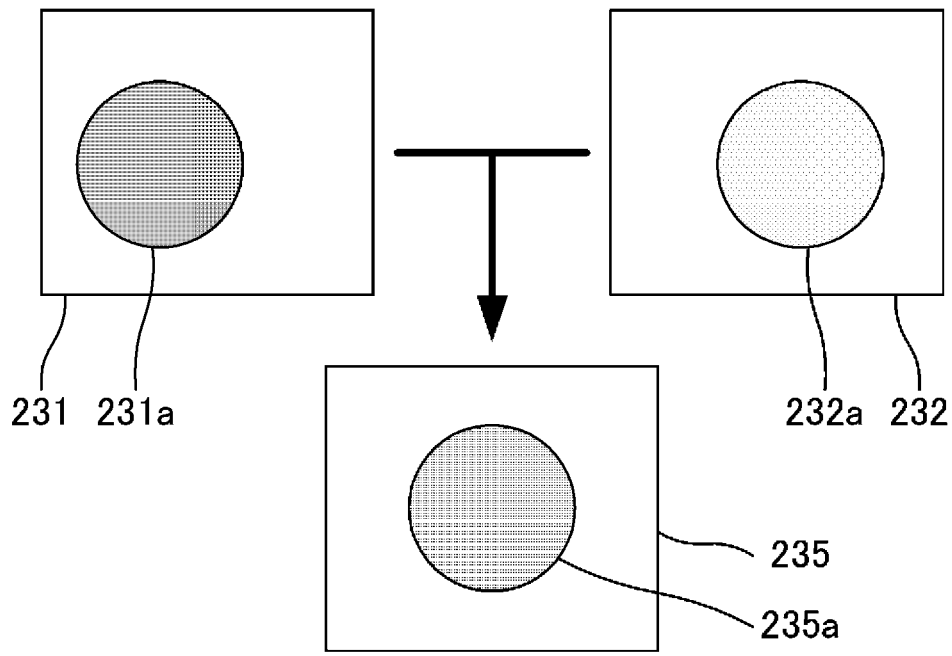
FIG. 21 illustrates a principle of generating image data by time interpolation using an image recognition.

FIG. 21 illustrates a principle of generating corresponding image data by time interpolation. Herein, as an example, two images 231 and 232 each captured at mutually different times $T_1$ (=Ta) and $T_1+\Delta T_1$ (=Tb) are interpolated, to thus generate a corresponding image 235 at the time $T_2$ (=Tc) between the times Ta and Tb. The image generator 61 applies image recognition to each of the two images 231 and 232 to extract targets 231a and 232a from the inside of each of the images, and calculates positions ra and rb within the images of the targets 231a and 232a and luminance values Ia and Ib of the targets 231a and 232a. As the image recognition, for example, template matching (autocorrelation method), optical flow method, segmentation method, and the like, can be employed.

The template matching is performed such that templates are superimposed while shifting the positions of the templates within an image to obtain an interphase, and a target is searched within the image by determining that a graphic matching the templates at the position at which the obtained interphase becomes maximum is present. Superimposing the templates on the image at the current time in the vicinity of the position at which the matching of the templates is achieved within the image prior to the current time allows the target to be efficiently searched from the inside of the image. Applying the template matching for each of the image prior to the current time and the image at the current time allows for a detection of the target, and a detection of the movement and/or the deformation of the target from the inside of the image.

The optical flow method is performed such that a movement vector representing the movement of a target between two images is calculated utilizing invariant features for the passage of time, that are, for example, luminance values of pixels or areas, which reflects the target.

The segmentation method performs such that, as described in the third embodiment, the movement and/or the deformation of a target can be detected over time by structurally classifying patterns in two images and comparing the classified structures to each other.

The image generator 61 calculates a target position rc and the intensity value Ic in the image 235 on the basis of the patterns each obtained in the images 231 and 232 at the two times Ta and Tb by image recognition. The target position rc and the intensity value Ic are calculated as, for example, rc=ca×ra+cb×rb and Ic=ca×Ia+cb×Ib, using the positions ra and rb of the targets 231a and 232a, and the intensity values Ia and Ib of the targets 231a and 232a. Here, the coefficients ca and cb are given as ca=|Tc−Tb|/|Tb−Ta| and cb=|Tc−Ta|/|Tb−Ta| using the imaging times Ta and Tb of the two images 231 and 232 and the time Tc for the image 235 to be generated. The image generator 61 generates the corresponding image 235 by displaying of a graphic having the same shape as the template at the intensity value Ic and at the position rc on a background such as a white background. The application of image recognition can generate the corresponding image 235 even when the target moves.

As illustrated in the bottom row of FIG. 20, the image generator 61 generates image data of the corresponding images 235 and 236 at each of the times $T_2$ and $T_{21}$ that have been selected in step 430, on the basis of image data of two images 231 and 232 captured at the times $T_1$ and $T_1+\Delta T_1$ among the plurality of microscopic image data of the first microscope 30. The image generator 61 generates image data of a corresponding image 237 at the time $T_1+\Delta T_1$ that has been selected in step 430, on the basis of image data of two images 233 and 234 captured at the times $T_2$ and $T_2+\Delta T_2$ among the plurality of microscopic image data of the second microscope 40.

Here, descriptions are further given, taking the corresponding image 237 as an example, that the microscopic image data of the time $T_1+\Delta T_1$ are selected among the plurality of microscopic image data of the first microscope 30, and are then specified as the first microscopic image data. Moreover, among the plurality of microscopic image data of the first microscope 30, there are specified, the second microscopic image data obtained at a second time $(T_2)$ being different from the first time $(T_1+\Delta T_1)$ at which the first microscopic image data has been obtained, and the third microscopic image data obtained at a third time $(T_2+\Delta T_2)$ being different from both the first time and the second time. The corresponding image 237 is generated on the basis of the second and third microscopic image data.

In step 450, the image output unit 62 integrates the image data generated by the image generator 61 in step 440 into the microscopic image data previously obtained in step 420, and compiles the integrated data into a time series image.

In step 460, the display 63 displays the time series image that has been compiled in step 450 on the screen.

As described above, since the time required for imaging of a specimen differs, for each microscope, in accordance with a resolution of each of the microscopes when the images of the specimen are captured by different microscopies using the first and second microscopes 30 and 40, an image captured at the same time as an image included in one time series image may not be included in the other time series image when the time series images are each formulated by a sequential imaging of an identical specimen by the first and second microscopes 30 and 40, and thus, the images captured at the same time, in each of time series images, may not be compared with each other. Further, since an identical specimen cannot be simultaneously captured in a case where illumination lights having an identical wavelengths or proximity wavelength spectra are used in the first and second microscopes 30 and 40, similarly, images captured at the same time may not be compared with each other. Even in such a case, generating image data corresponding to the time at which the image of one time series image from the microscopic image data of the other time series image to perform an interpolation enables a comparison between images, in each of time series images, captured at the same time.

Note that, under the microscopic observation of the microscope system 100 according to the fourth embodiment, image recognition is applied in step 440 to thus generate image data, however, alternatively, the intensity values of the two images may be simply calculated without the application of image recognition to thus generate image data.

Figure 22:
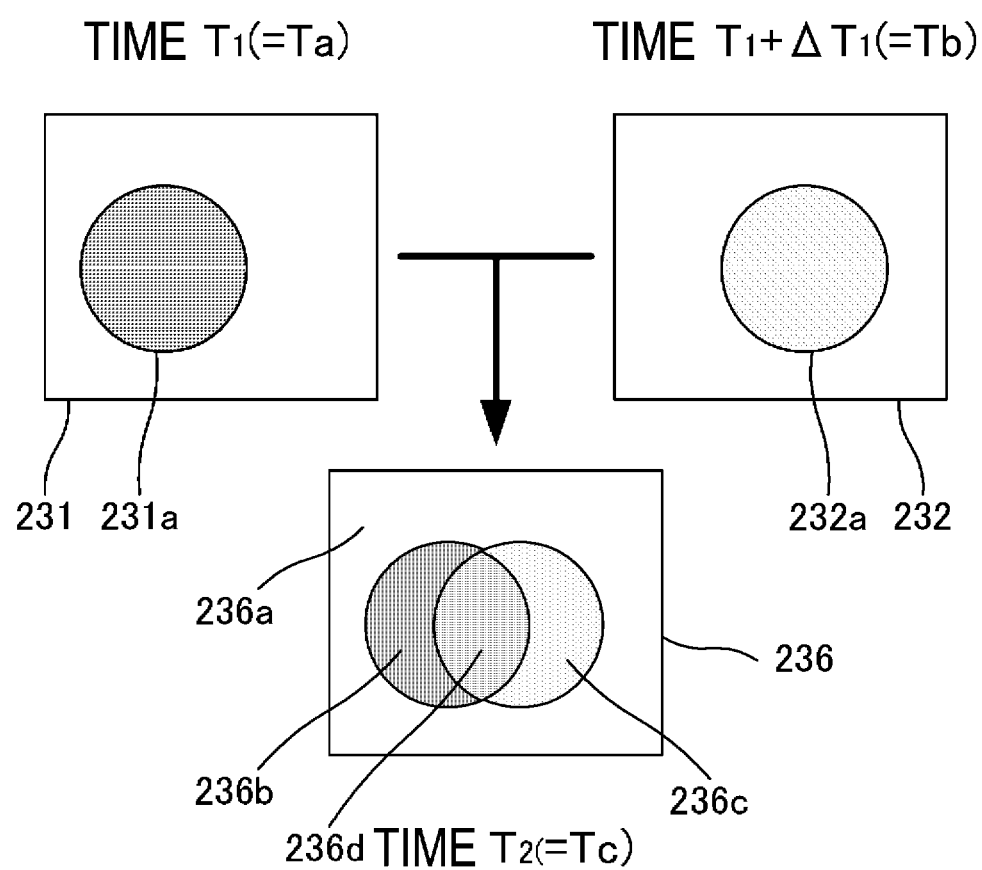
FIG. 22 illustrates a principle of generating image data by time interpolation using an intensity value calculation.

FIG. 22 illustrates a principle of generating processed image data by time interpolation using an intensity value calculation. Herein, an interpolation is performed on two images 231 and 232 captured at different times Ta ($=T_1$) and Tb ($=T_1+\Delta T_1$), to thus generate an image 236 at the time Tc ($=T_{21}$) between the times Ta and Tb. The image generator 61 calculates the intensity value Ic=ca×Ia+cb×Ib of the image 236 using the intensity values Ia and Ib of the whole of the two images 231 and 232. Here, the coefficients ca and cb are given as ca=|Tc−Tb|/|Tb−Ta| and cb=|Tc−Ta|/|Tb−Ta| using the imaging times Ta and Tb of the two images 231 and 232, and the time Tc for the image 236 to be generated. Thereby, for example, in a case where the target 231a is reflected at the intensity value Ia on a white background in the image 231, and the target 232a is reflected at the intensity value Ib on a white background in the image 232, in the image 236, a target 236b corresponding to a part of the target 231a within the image 231 is reflected at an intensity value Ia on a white background 236a, a target 236c corresponding to a part of the target 232a within the image 232 is reflected at an intensity value Ib, and a target 236d corresponding to the superimpose of the target 231a within the image 231 and the target 232a within the image 232 is reflected at the intensity value Ic.

Note that, under the microscopic observation of the microscope system 100 according to the fourth embodiment, an image at a target time Tc between the times Ta and Tb (i.e., Ta<Tc<Tb) is generated by interpolating of the two images captured at different times Ta and Tb (i.e., Ta<Tb) by utilizing the image recognition in step 440 or the intensity value calculation described above, however, the target time Tc is not necessarily the time between the times at which at least two different images to be used for the interpolation are obtained. That is, at least two different images may be used to be extrapolated into the time earlier or later (i.e., Tc<Ta or Tc>Tb) than the times (Ta and Tb) at which the images are obtained, to thus generate image data corresponding to the target time.

Note that, under the microscopy observation of the microscope system 100 according to the fourth embodiment, different objective lenses 21a and 21b are used under the first and second observation conditions, and images of the specimen 9 are alternately captured by the first and second microscopes 30 and 40 in step 420, however, a common objective lens may be used under the first and second observation conditions, and images of the specimen 9 may be captured in parallel to each other by the first and second microscopes 30 and 40. The details are as described in the first embodiment. However, two different fluorescent dyes are introduced into the specimen 9 under the first and second microscopies, and in correspondence to this, mutually different wavelengths are employed in the illumination conditions. Additionally, as conditions for time-lapse imaging to be performed in parallel, there are given, for example, an imaging start time $T_1=T_2$, an imaging interval $\Delta T_1<\Delta T_2$, the number $N_1>N_2$ of the images to be captured, and the like. The time required for imaging in the first and second microscopes 30 and 40 is determined in accordance with the respective microscopies, for example. The imaging intervals $\Delta T_1$ and $\Delta T_2$ of the first and second microscopes 30 and 40 are determined in accordance with, for example, the time required for imaging in the respective microscopies, and the processing rate, by the image processor 60, of processing the imaging results obtained by the first and second illumination/imaging units 31 and 41, and the like. Thus, images of specimens can be captured at different times by the first and second microscopes 30 and 40.

Figure 23:
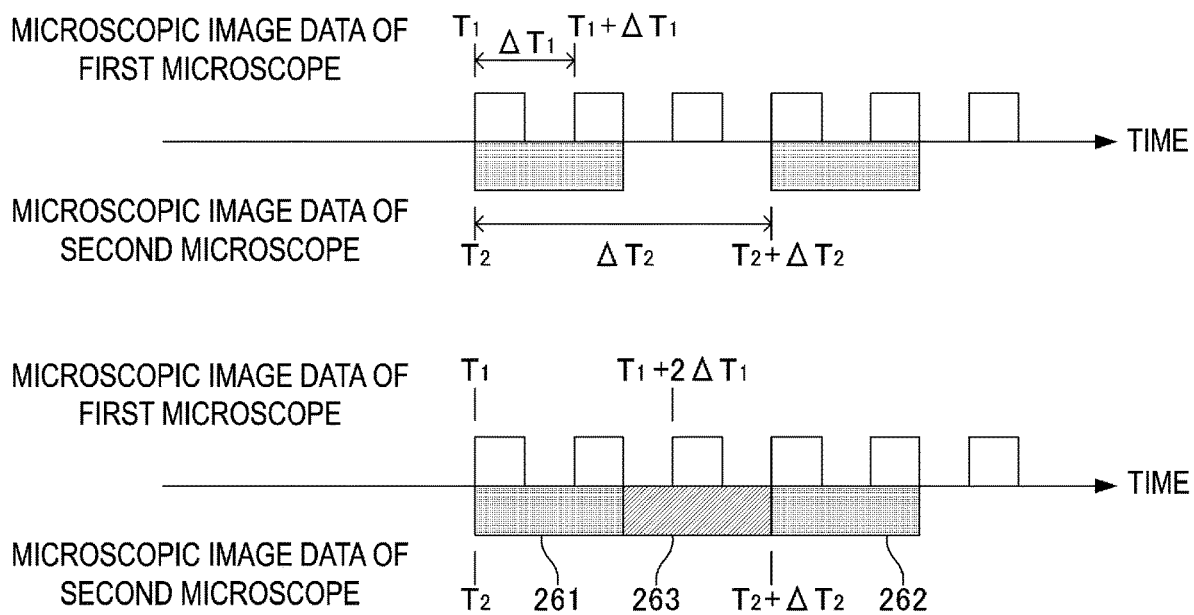
FIG. 23 illustrates another example of a timing chart in which imaging of a specimen is performed by first and second microscopes.

FIG. 23, upper row, illustrates another example of a timing chart in which imaging of a specimen is performed in parallel by the first and second microscopes 30 and 40. The first and second microscopic image data include a series of image data, each of which are obtained at a plurality of times under the first and second observation conditions. Because of the conditions for time-lapse imaging to be performed in parallel, when imaging of a specimen at different imaging intervals $\Delta T_1$ and $\Delta T_2$ by the first and second microscopes 30 and 40, an image of the specimen may not be captured by one microscope at the time when the image of the specimen is captured by the other microscope, and thus, images captured by the microscopes may not be compared with each other. Thus, for example, as illustrated in the bottom row of FIG. 23, image data of an image 263 at the time $T_1+2\Delta T_1$ are generated based on image data of two images 261 and 262 captured at the times $T_2$ and $T_2+\Delta T_2$ included in the second microscopic image data, to thus perform an interpolation of the images, thereby making it possible to compare the images captured by the microscopes with each other.

In the fourth embodiment, corresponding image data are generated at the same time as the time of capturing of the first microscopic image data specified in the above step 430. However, the time of the corresponding image data may not be the same as the time of the first microscopic image data, and the time of the corresponding image data may be different from the time of the first microscopic image data in a range that does not interfere with the comparison between the image based on the first microscopic image data and the image based on the comparison image data. That is, the corresponding image data can correspond to the first microscopic image data, not when the corresponding image data are the same in time as the first microscope image data, but even when the corresponding image data and the first microscopic image data differ from each other in time in a range that does not interfere with the comparison between the image based on the first microscopic image data and the image based on the comparison image data.

Note that, in the microscope system 100 according to the embodiment, the first and second microscopes 30 and 40 each employ confocal microscopy and structured illumination microscopy (SIM), however, without being limited to this, the first and second microscopes 30 and 40 may employ the same microscopy, for example, the same confocal microscopy. In such a case, an image of a specimen may be captured by a polychromatic fluorescence method, that is, by introducing a plurality of (e.g., two) fluorescent dyes into the specimen, and illuminating the specimen with a plurality of illumination light each having a different wavelength in the first and second microscopes 30 and 40, to thus detect fluorescence emitted from each of the fluorescent dyes within the specimen. This allows for a simultaneous observation of different portions of the specimen into which different fluorescent substances are introduced.

Note that, in the microscope system 100 according to the fourth embodiment, images of a specimen are alternately captured by the first and second microscopes 30 and 40, however, each of the first and second microscopes 30 and 40 may have an individual stage and an optical system as dedicated components, where images of an identical specimen are individually captured. In such a case, a marker may be provided, in proximity to the specimen, on the holding member 8 for holding the specimen, where an image of the specimen can be captured within a range equal to each other by determining the position of the specimen relative to the marker in observing the specimen with each of the microscopes.

Note that under the microscopic observation of the microscope system 100 according to the first to fourth embodiments, the user selects the target space or target time to generate image data by interpolation in steps 130, 230, 330, and 430, however, alternatively, the image generator 61 may automatically select the target space or target time. In such a case, in the first to third embodiments, the target space can be selected by specifying captured images missing in the first and second microscopic image data, on the basis of the imaging conditions included in the first and second observation conditions, the reference position in the optical-axis direction, the step amount in the optical-axis direction, the number of images to be captured, and the like. Further, in the fourth embodiment, the target time can be selected from the imaging conditions included in the first and second observation conditions, the imaging start time, the imaging interval, the number of images to be captured, and the like.

Note that, under the microscopic observation of the microscope system 100 according to the first to third embodiments, the sampling condition is confirmed prior to the generation of image data for the target space, however, alternatively, the sampling condition may be confirmed after the generation of the image data.

Note that, under the microscopic observation of the microscope system 100 according to the first to fourth embodiments, the image output unit 62 integrates the corresponding image data generated by interpolation by the image generator 61 into the microscopic image data obtained by the imaging by the second microscope 40 (or the first microscope 30), to thus compile the integrated data into a series of image data such as a Z stack image, a time series image, or the like in steps 170, 270, 380, and 450, and causes the series of image data to be displayed on the screen of the display 63 in steps 180, 280, 390, and 460, however, the corresponding image data generated by interpolation may not be integrated into the microscopic image data obtained by the imaging, and the image based on the corresponding image data and the image based on the first microscopic image data corresponding to the corresponding image data may be displayed on the screen of the display 63. The display 63 may display the corresponding image without causing the corresponding image to be associated with a microscopic image by the other microscopy.

Note that, under the microscopic observation of the microscope system 100 according to the first to fourth embodiments, a Z-stack image is generated by imaging of the plurality of Z positions of the specimen 9 in confocal microscopiesIM, and electron microscopy, however, an image of one Z position of the specimen 9 may be captured. Similarly, even in the STORM, a plurality of Z positions of the specimen 9 are captured to generate a STORM image, however, an image of only one Z position of the specimen 9 may be captured to generate a STORM image.

Note that, in the microscope system 100 according to the first to fourth embodiments, the image processor 60 may process image data obtained by a microscope separate from the microscope system 100, in addition to the microscopic image data sent from the first and second microscopes 30 and 40. Further, the image output unit 62 may process the microscopic image data obtained by the microscope system 100 to display a microscopic image captured by a separate microscope and a microscopic image captured by the microscope system 100 juxtaposed to each other or superimposed with each other on the screen of the display 63.

Note that in the microscope system 100 according to the first to fourth embodiments, the imaging elements of the first and second illumination/imaging units 31 and 41 may be a charge coupled device (CCD), a CMOS, or the like, and may be a light receiving element such as a photomultiplier tube (PMT) in place of the imaging element. A suitable element may also be employed in accordance with the wavelength of the light that is received.

Note that, in the microscope system 100 according to the first to fourth embodiments, any microscopy may be employed for the first and second microscopes 30 and 40, which is, for example, positron emission tomography (PET), magnetic resonance imaging (MRI), computed tomography (CT), stereo fluorescence microscopy, epifluorescence microscopy, confocal microscopiestructured illumination microscopy (SIM), stochastic optical reconstruction microscopy (STORM), photoactivation localization method (PALM), stimulated emission depletion (STED), electron microscopy, atomic force microscopy, or the like. Further, the microscope system 100 according to the fourth embodiment includes two microscopes each employing two microscopies, and may include, without being limited to this, three or more microscopes each employing three or more microscopies. The microscope system 100 may also include at least two microscopes each employing the same microscopy.

The first microscope 30 and the second microscope 40 may use an identical type of fluorescent dye, or fluorescent dyes of three or more colors. Further, one or both of the first microscope 30 and the second microscope 40 may capture an image of the specimen 9 by autofluorescence or reflected illumination without using a fluorescent dye. Even when one or both of the first microscope 30 and the second microscope 40 uses no fluorescent dye, the specimen 9 may be damaged in different degrees due to the difference in wavelengths of illumination lights between the first microscope 30 and the second microscope 40. Thus, there may be a case in which an imaging is performed by one of the first microscope 30 and the second microscope 40 at a Z position of the specimen 9, while an imaging is not performed by the other of the first microscope 30 and the second microscope 40. In such a case as well, generating corresponding images to perform an interpolation enables an easy comparison between the microscopic images obtained from the first and second microscopes 30 and 40. Further, even if the image is missed due to the user or the like's failure of capturing images, the comparison is made possible by generating the corresponding image to thus enable performing an interpolation.

Note that, in the microscope system 100 according to the first to fourth embodiments, a configuration is employed in which the specimen 9 is caused to move relative to the focal point of the objective lenses 21a and 21b by driving of the stage 11 for supporting the specimen 9 in the Z-axis direction, however, alternatively, a configuration may be employed in which the specimen 9 is caused to move relative to the focal point of the objective lenses 21a and 21b by driving of the revolver for supporting the objective lenses 21a and 21b in the Z-axis direction, or by disposing of an optical element having a refractive power on the optical axis L of the optical system 20, and causing the optical element to move in a direction parallel to the optical axis L.

Note that in the microscope system 100 according to the first to fourth embodiments, the first and second microscopes 30 and 40 are operated or stopped by performing or stopping emission of illumination light from the first and second illumination/imaging units 31 and 41, however, the first and second microscopes 30 and 40 may be operated or stopped by disposing or retracting of a filter such as a dichroic mirror or the like on the optical axis L of the optical system 20 and supplying or not supplying of illumination light to the optical system 20.

Note that, in the microscope system 100 according to the first to fourth embodiments, an inverted-type microscope system is employed in which the objective lenses 21a and 21b are disposed below the stage 11 for supporting the specimen 9, and the specimen is observed from below, however, alternatively, an upright-type microscope system may be employed in which the objective lenses 21a and 21b are disposed above the stage 11 to observe the specimen from above. Further, either an inverted or upright-type may be employed for each microscope.

Note that in the first to fourth embodiments, although the microscopic image data of the first microscope 30 can be the first microscopic image data, separate names are used, for convenience of explanation. Similarly, although the microscopic image data of the second microscope 40 can be the second microscopic image data and the third microscopic image data, separate names are used, for convenience of explanation.

Various embodiments of the present disclosure may be described with reference to flowcharts and block diagrams, where blocks may represent (1) a stage of process in which the operations are performed, or (2) a section of apparatus responsible for performing the operations. Predetermined stages and sections may be implemented by dedicated circuitry, programmable circuitry supplied with computer readable instructions stored on computer-readable medium, and/or processor supplied with computer readable instructions stored on computer-readable medium. The dedicated circuit may include digital and/or analog hardware circuitry and may include integrated circuitry (IC) and/or discrete circuitry. Programmable circuitry may include reconfigurable hardware circuitry, containing memory elements, such as logic AND, logic OR, logic XOR, logic NAND, logic NOR, and other logic operations, flip-flop, register, field-programmable gate array (FPGA), programmable logic array (PLA), and the like.

The computer-readable medium may include any tangible device that can store instructions for execution by a suitable device, such that a computer-readable medium having instructions stored therein includes an article of manufacture including instructions that can be executed to create means for performing operations specified in the flowcharts or block diagrams. Examples of computer readable media may include an electronic storage medium, a magnetic storage media, an optical storage medium, an electromagnetic storage medium, a semiconductor storage medium, and the like. More specific examples of computer-readable media may include a floppy (trade name) disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY® disc, a memory stick, an integrated circuit card, and the like.

The computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, JAVA (trade name), C++, or the like, and traditional procedural programming languages, such as the "C" programming language or similar programming languages.

The computer-readable instructions may be provided to a processor of a general purpose computer, special purpose computer, or other programmable data processing apparatus, or to programmable circuitry, locally or via a local area network (LAN), wide area network (WAN) such as the Internet, or the like, to execute the computer-readable instructions to create means for performing operations specified in the flowcharts or block diagrams. Examples of processors include computer processors, processing units, microprocessors, digital signal processors, controllers, microcontrollers, and the like.

Figure 24:
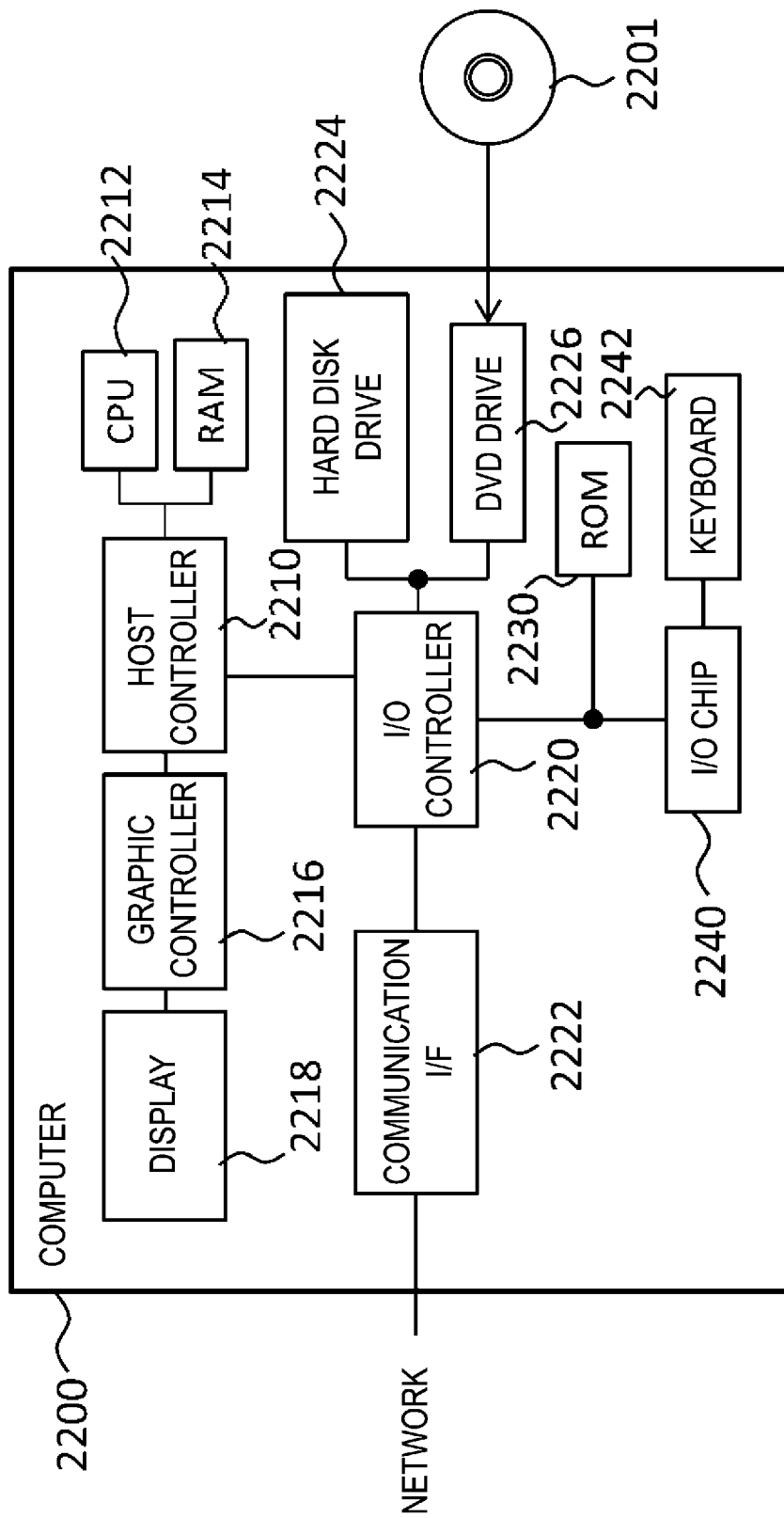
FIG. 24 illustrates an example of a configuration of a computer according to the present embodiment.

FIG. 24 illustrates an example of a computer 2200 in which a plurality of aspects of the present disclosure may be embodied in whole or in part. A program installed in the computer 2200 may cause the computer 2200 to function as an operation associated with the device according to the embodiment(s) of the present disclosure or as one or a plurality of sections of the device, or may cause the operation or the one or the plurality of section(s) to be executed, and/or may cause the computer 2200 to execute a process or a stage of the process according to the embodiment(s) of the present disclosure. Such a program may be executed by a CPU 2212 to cause the computer 2200 to perform predetermined operations associated with some or all of the flowchart and blocks of block diagram described in the present specification.

The computer 2200 according to the fourth embodiment includes a CPU 2212, a RAM 2214, a graphic controller 2216, and a display 2218, which are interconnected by a host controller 2210. The computer 2200 also includes an input/output unit, such as a communication interface 2222, a hard disk drive 2224, a DVD-ROM drive 2226, and an IC card drive, which are connected to the host controller 2210 via an input/output controller 2220. The computer also includes a legacy input/output unit, such as a ROM 2230 and a keyboard 2242, which are connected to the input/output controller 2220 via an input/output chip 2240.

The CPU 2212 operates in accordance with the programs stored on the ROM 2230 and the RAM 2214, thereby controlling each of the units. A graphic controller 2216 retrieves image data generated by the CPU 2212 in a frame buffer or the like provided in the RAM 2214 or itself and causes the image data to be displayed on the display 2218.

The communication interface 2222 communicates with other electronic devices via a network. The hard disk drive 2224 stores programs and data used by the CPU 2212 within the computer 2200. The DVD-ROM drive 2226 reads the program or data from a DVD-ROM 2201, and provides the program or data to the hard disk drive 2224 via the RAM 2214. The IC card drive reads the program and data from the IC card and/or writes the program and data to the IC card.

The ROM 2230 stores therein a boot program and the like to be executed by the computer 2200 at the time of activation and/or a program that depends on hardware of the computer 2200. The input/output chip 2240 may also connect various input/output units to the input/output controller 2220 via a parallel port, a serial port, a keyboard port, a mouse port, or the like.

Programs are provided by a computer-readable medium such as the DVD-ROM 2201 or the IC card. The programs are read out from the computer-readable medium and installed on the hard disk drive 2224, the RAM 2214, or the ROM 2230, which are also examples of the computer-readable medium, to be executed by the CPU 2212. The information processing described in these programs is read out by the computer 2200, resulting in coordination between the programs and the above-described various types of hardware resources. The devices or the methods may be constituted by implementing operations or processing of information in accordance with usage of the computer 2200.

For example, in a case where communication is executed between the computer 2200 and an external device, the CPU 2212 may execute a communication program loaded into the RAM 2214 and instructs the communication interface 2222 to implement the communication processing according to processing described in the communication program. Under control of the CPU 2212, the communication interface 2222 reads out transmission data stored on a transmission buffer processing region provided in a recording medium such as the RAM 2214, the hard disk drive 2224, the DVD-ROM 2201, or the IC card, and then sends the read transmission data to network or writes data received from the network into a reception buffer processing region provided in the recording medium or the like.

Also, the CPU 2212 may operate such that all or a necessary portion of a file or database stored on an external recording medium such as the hard disk drive 2224, the DVD-ROM drive 2226 (DVD-ROM 2201) or the IC card is read by the RAM 2214. Various types of processing may be performed on the data on the RAM 2214. The CPU 2212 subsequently writes back the processed data to the external recording medium.

Various types of information such as various types of programs, data, tables, and databases may be stored on a recording medium, and then information processing may be performed on the information. The CPU 2212 may execute, on the data read out from the RAM 2214, various types of processing that include various types of operations, information processing, conditional judgment, conditional branch, unconditional branch, information searching/replacement, and the like as described throughout in the disclosure herein or specified by instruction sequences of programs. Then, the CPU 2212 writes back the result into the RAM 2214. Also, the CPU 2212 may search for information in files, database, or the like in a recording medium. For example, in a case where a recording medium stores a plurality of entries each having an attribute value of a first attribute associated with an attribute value of a second attribute, the CPU 2212 may search an entry, out of the plurality of entries, that has an attribute value of the first attribute matching a specified condition. Then, the CPU 2212 may read out an attribute value of the second attribute stored in the entry and acquire the attribute value of the second attribute associated with the first attribute that satisfies the predetermined condition.

The above-described programs or the software modules may be stored in a computer-readable medium in or near the computer 2200. Also, a recording medium such as a hard disk or a RAM provided in a server system connected to a dedicated communication network or the Internet can be used as the computer-readable medium, whereby a program is provided to the computer 2200 via the network.

While the present disclosure has been described with reference to the embodiments, the technical scope of the present disclosure is not limited to the aforementioned embodiments. It is apparent to persons skilled in the art that various alterations and improvements can be added to the aforementioned embodiments. It is also apparent from the scope of the claims that the embodiments added with such alterations or improvements can be included in the technical scope of the present disclosure.

In the device, system, program, and method disclosed in the claims, the description, and the drawings, it should be noticed that the order of execution of each of the processes such as the operation, procedures, steps, and stages is not explicitly described as "before", "prior to", or the like, and can be realized in any order as long as the output of the previous process is used in subsequent processing. The terms "first", "next", and the like are used with respect to the operation flow in the claims, the specification, and the drawings for the sake of convenience, but do not means that it is implemented to perform in this order.

The invention claimed is:

1. A microscope system, comprising:
a first microscope using a first microscopy;
a second microscope using a second microscopy that is different from the first microscopy; and
an image processor comprising:
   an obtaining unit configured to obtain first microscopic image data obtained by the first microscopy and second microscopic image data obtained by the second microscopy that is different from the first microscopy; and
   an image generator configured to generate, based on the second microscopic image data, corresponding image data of the second microscopy corresponding to the first microscopic image data, wherein
the first microscopic image data and the second microscopic image data are obtained from the same observation position of the first and second microscopes.

2. The microscope system according to claim 1, wherein the corresponding image data is image data corresponding to a first plane from which the first microscopic image data is obtained, and
the second microscopic image data, which is not obtained from the first plane, is image data on a second plane and a third plane, the second and third planes being different from the first plane.

3. The microscope system according to claim 2, wherein the image generator is configured to generate the corresponding image data by performing Fourier transform and inverse Fourier transform on the second microscopic image data on the second plane and the third plane.

4. The microscope system according to claim 2, wherein the first plane is a plane between the second plane and the third plane.

5. The microscope system according to claim 2, wherein the second microscopy is a localization method, and
the image generator is configured to generate the corresponding image data by extracting image data within a focal depth of the first microscope using the first microscopy from the second microscopic image data.

6. The microscope system according to claim 2, wherein the image generator is configured to generate the corresponding image data based on (i) a first pattern in an image that is based on the second microscopic image data on the second plane and (ii) a second pattern in an image that is based on the second microscopic image data on the third plane, the second pattern corresponding to the first pattern.

7. The microscope system according to claim 1, wherein the corresponding image data is image data corresponding to a first time at which the first microscopic image data is obtained, and
the second microscopic image data is image data corresponding to a second time and to a third time, which are different from the first time.

8. The microscope system according to claim 7, wherein the first time is between the second time and the third time.

9. The microscope system according to claim 7, wherein the image generator is configured to generate the corresponding image data based on (i) a first pattern in an image that is based on the second microscopic image data obtained at the second time and (ii) a second pattern in an image that is based on the second microscopic image data obtained at the third time.

10. The microscope system according to claim 1, further comprising an evaluator configured
to perform an evaluation on the corresponding image data based on an observation condition, in the second microscopy, of the second microscopic image data.

11. The microscope system according to claim 1, further comprising:
a display; and
an input unit.

12. The microscope system according to claim 1, wherein the image generator is configured to generate, based on the second microscopic image data, the corresponding image data corresponding to a position at which the first microscopic image data is obtained.

13. The microscope system according to claim 2, wherein the image generator is configured to generate, based on the second microscopic image data, the corresponding image data based on a distance between the first plane and the second plane, a distance between the first plane and the third plane, and the second microscopic image data.

14. The microscope system according to claim 1, wherein the image generator is configured to generate, based on the second microscopic image data, the corresponding image data corresponding to a focal depth of the first microscope using the first microscopy.

15. The microscope system according to claim 1, wherein the image generator is configured to generate, based on the second microscopic image data, the corresponding image data corresponding to a time at which the first microscopic image data are obtained.

16. The microscope system according to claim 9, wherein the image generator is configured to generate the corresponding image data based on (i) a position of the first pattern, (ii) an intensity of the first pattern, (iii) a position of the second pattern, and (iv) an intensity of the second pattern, the first pattern corresponding to the second pattern.

17. The microscope system according to claim 9, wherein the image generator is configured to generate the corresponding image data based on an intensity of the first pattern and an intensity of the second pattern.

18. The microscope system according to claim 1, wherein the corresponding image data is image data corresponding to the second microscopic image data that has not been obtained.

19. The microscope system according to claim 1, further comprising an image output unit configured to output the corresponding image data or the first microscopic image data to a display such that the display displays an image based on the corresponding image data or both the image based on the corresponding image data and an image based on the first microscopic image data.

20. The microscope system according to claim 19, wherein the image output unit is configured to output the corresponding image data such that the image based on the corresponding image data is visually distinguishable from an image based on the second microscopic image data.

21. The processor microscope system according to claim 1, wherein the image generator is configured to:
determine whether the second microscopic image data corresponding to the first microscopic image data exists based on an observation condition of the first microscopy and an observation condition of the second microscopy, and
generate the corresponding image data in a case that the image generator has determined that the second microscopic image data does not exist.

22. The microscope system according to claim 19, wherein the image output unit is configured to output the first microscopic image data and the second microscopic image data to the display such that the display displays the image based on the first microscopic image data and an image based on the second microscopic image data, and
the image processor further comprises an accepting unit configured to accept an instruction of generating the corresponding image data via an input unit.

23. The microscope system according to claim 10, wherein the evaluator is configured to determine, based on the observation condition of the second microscopic image data in the second microscopy, whether to generate the corresponding image data or obtain the second microscopic image data corresponding to the first microscopic image data by using the second microscopy.

24. The microscope system according to claim 19, further comprising an evaluator configured to perform an evaluation on the corresponding image data based on an observation condition, in the second microscopy, of the second microscopic image data,
the image output unit being configured to output a result of the evaluation on the corresponding image data to a display such that the display displays the result of the evaluation on the corresponding image data, and the image processor further comprises an accepting unit configured to accept, via an input unit, an instruction of generating the corresponding image data or an instruction of obtaining the second microscopic image data corresponding to the first microscopic image data by using the second microscopy.

25. An image processing method comprising:
obtaining (i) first microscopic image data by a first microscopy used by a first microscope and (ii) second microscopic image data by a second microscopy that is different from the first microscopy and is used by a second microscope; and
generating, based on the second microscopic image data and third microscopic image data, corresponding image data of the second microscopy corresponding to the first microscopic image data, wherein
the first microscopic image data and the second microscopic image data are obtained from the same observation position of the first and second microscopes.

26. The image processing method according to claim 25, wherein
the corresponding image data is image data corresponding to a first plane from which the first microscopic image data is obtained, and
the second microscopic image data, which is not obtained from the first plane, is image data on a second plane and a third plane, which are different from the first plane.

27. The image processing method according to claim 26, wherein, in a case that generating the corresponding image data is performed, Fourier transform and inverse Fourier transform are performed on the second microscopic image data on the second plane and the third plane to generate the corresponding image data.

28. The image processing method according to claim 26, wherein the first plane is a plane between the second plane and the third plane.

29. The image processing method according to claim 26, wherein
the second microscopy is a localization method, and
in a case that generating the corresponding image data is performed, the corresponding image data is generated by extracting image data within a focal depth of the first microscope using the first microscopy from the second microscopic image data.

30. The image processing method according to claim 26, wherein
in a case that generating the corresponding image data is performed, the corresponding image data is generated based on (i) a first pattern in an image based on the second microscopic image data on the second plane and (ii) a second pattern in an image based on the second microscopic image data on the third plane, the second pattern corresponding to the first pattern.

31. The image processing method according to claim 25, wherein
the corresponding image data is image data corresponding to a first time at which the first microscopic image data is obtained, and
the second microscopic image data is image data corresponding to a second time and to a third time, which are different from the first time.

32. The image processing method according to claim 31, wherein
the first time is between the second time and the third time.

33. The image processing method according to claim 31, wherein
in a case that generating the corresponding image data is performed, the corresponding image data is generated based on (i) a pattern in an image based on the second microscopic image data obtained at the second time and (ii) a pattern in an image based on the second microscopic image data obtained at the third time.

34. The image processing method according to claim 25, further comprising
evaluating the corresponding image data based on an observation condition, in the second microscopy, of the second microscopic image data.

35. The image processing method according to claim 25, further comprising outputting the corresponding image data or the first microscopic image data to a display such that the display displays an image based on the corresponding image data or both the image based on the corresponding image data and an image based on the first microscopic image data.

36. A non-transitory computer-readable medium storing a program for causing a computer to:
obtain (i) first microscopic image data by a first microscopy used by a first microscope and (ii) second microscopic image data by a second microscopy that is different from the first microscopy and is used by a second microscope; and
generate, based on the second microscopic image data, corresponding image data of the second microscopy corresponding to the first microscopic image, wherein
the first microscopic image data and the second microscopic image data are obtained from the same observation position of the first and second microscopes.

37. The non-transitory computer-readable medium storing the program according to claim 36, wherein the program further causes the computer to output the corresponding image data or the first microscopic image data to a display such that the display displays an image based on the corresponding image data or both the image based on the corresponding image data and an image based on the first microscopic image data.

* * * * *

UNITED STATES PATENT AND TRADEMARK OFFICE
CERTIFICATE OF CORRECTION

PATENT NO. : 11,442,262 B2  
APPLICATION NO. : 16/478434  
DATED : September 13, 2022  
INVENTOR(S) : Sase et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 515 days.

Signed and Sealed this  
Eleventh Day of February, 2025

Coke Morgan Stewart  
*Acting Director of the United States Patent and Trademark Office*